United States Patent
Vlasenko

(10) Patent No.: US 7,679,418 B2
(45) Date of Patent: Mar. 16, 2010

(54) VOLTAGE LEVEL SHIFTER AND BUFFER USING SAME

(75) Inventor: Peter A. Vlasenko, Kanata (CA)

(73) Assignee: MOSAID Technologies Incorporated, Ottawa, Ontario (CA)

(*) Notice: Subject to any disclaimer, the term of this patent is extended or adjusted under 35 U.S.C. 154(b) by 0 days.

(21) Appl. No.: 11/741,383

(22) Filed: Apr. 27, 2007

(65) Prior Publication Data

US 2008/0265970 A1    Oct. 30, 2008

(51) Int. Cl.
    H03L 5/00    (2006.01)
(52) U.S. Cl. .................. 327/333; 326/62; 326/63; 326/64; 326/68
(58) Field of Classification Search .......... 326/62, 326/63, 68, 80, 81, 141, 144–163; 327/333; 365/189.11; 331/1 A, 15–17; 375/373–376
    See application file for complete search history.

(56) References Cited

U.S. PATENT DOCUMENTS

| 4,689,504 | A | | 8/1987 | Raghunathan et al. |
| 4,728,901 | A | | 3/1988 | Pepper |
| 4,978,870 | A | | 12/1990 | Chen et al. |
| 4,996,443 | A | * | 2/1991 | Tateno .................. 326/68 |
| 5,528,173 | A | | 6/1996 | Merritt et al. |
| 5,606,268 | A | * | 2/1997 | Van Brunt .................. 326/68 |
| 5,666,070 | A | | 9/1997 | Merritt et al. |
| 5,808,501 | A | | 9/1998 | Ivanov |
| 6,011,421 | A | | 1/2000 | Jung |
| 6,060,904 | A | | 5/2000 | Shimoda |
| 6,177,824 | B1 | | 1/2001 | Amanai |
| 6,271,707 | B1 | | 8/2001 | Le et al. |
| 6,285,233 | B1 | | 9/2001 | Ribellino et al. |
| 6,445,210 | B2 | | 9/2002 | Nojiri |
| 6,510,089 | B2 | * | 1/2003 | Taura et al. ............ 365/189.11 |
| 6,567,067 | B2 | | 5/2003 | Azami |
| 6,600,358 | B1 | | 7/2003 | Chan |
| 6,646,918 | B2 | | 11/2003 | Kurokawa et al. |
| 6,664,809 | B1 | | 12/2003 | Chiu |
| 6,700,407 | B1 | | 3/2004 | Wert |
| 6,734,705 | B2 | | 5/2004 | Pulkin et al. |

(Continued)

OTHER PUBLICATIONS

John G. Maneatis, Low Jitter Process-Independent DLL and PLL Based on Self-Biased Techniques. IEEE Journal of Solid-State Circuits, Nov. 2006, vol. 31, No. 11, Silicon Graphics, Inc., Mountain View, CA 94043.

(Continued)

Primary Examiner—Lincoln Donovan
Assistant Examiner—Brandon S Cole
(74) Attorney, Agent, or Firm—Ridout & Maybee LLP

(57) ABSTRACT

A voltage level shifter with an input transistor pair, a cross-coupled load chain transistor pair and a pair of current sources, effects reduced power consumption through the use of the cross-coupled load chain transistor pair to minimize the DC current component present in known voltage level shifters. In specific embodiments, feedback elements may be used to minimize delays in signal transitions. A reference voltage that corresponds to a current capability of the input transistor pair may be used to regulate the current sources in the load chain. Changes in a swing of the input signal voltage received by the input transistor pair may be reflected in corresponding changes to the reference voltage. The voltage level shifter may be of particular use in a buffer.

5 Claims, 10 Drawing Sheets

U.S. PATENT DOCUMENTS

| | | |
|---|---|---|
| 6,768,367 B1 | 7/2004 | Meadows et al. |
| 6,768,368 B2 | 7/2004 | Kaneko et al. |
| 6,788,125 B1 | 9/2004 | Tomsio |
| 6,819,159 B1 | 11/2004 | Lencioni |
| 6,833,746 B2 | 12/2004 | Drapkin et al. |
| 6,842,043 B1 | 1/2005 | Nguyen et al. |
| 6,924,689 B2 * | 8/2005 | Randazzo et al. ............ 327/333 |
| 6,947,328 B1 | 9/2005 | Smidt et al. |
| 6,963,226 B2 | 11/2005 | Chiang |
| 6,980,194 B2 * | 12/2005 | Tobita ......................... 345/100 |
| 6,998,668 B2 | 2/2006 | Nakase et al. |
| 7,129,752 B2 | 10/2006 | Bayer |
| 7,348,801 B2 * | 3/2008 | Nojiri .......................... 326/81 |
| 7,375,574 B2 * | 5/2008 | Kanno et al. ................. 327/333 |
| 2001/0013795 A1 | 8/2001 | Nojiri |
| 2004/0085092 A1 | 5/2004 | Aoki |
| 2004/0169543 A1 | 9/2004 | Doutreloigne et al. |
| 2004/0201410 A1 * | 10/2004 | Koyama et al. ............. 327/333 |
| 2004/0217798 A1 | 11/2004 | Lencioni |
| 2004/0232944 A1 | 11/2004 | Bu et al. |
| 2005/0017755 A1 | 1/2005 | Chiang |
| 2005/0110553 A1 | 5/2005 | Chin et al. |
| 2005/0151574 A1 | 7/2005 | Lin |
| 2006/0033530 A1 | 2/2006 | Seo |
| 2006/0049859 A1 | 3/2006 | Hwang et al. |
| 2006/0091908 A1 | 5/2006 | Kang et al. |
| 2006/0186921 A1 | 8/2006 | Chen et al. |
| 2006/0192587 A1 * | 8/2006 | Bhattacharya et al. ........ 326/80 |
| 2006/0208759 A1 | 9/2006 | Nojiri |
| 2006/0226873 A1 | 10/2006 | De Sandre et al. |
| 2006/0226874 A1 | 10/2006 | Kim |
| 2006/0226875 A1 | 10/2006 | Shimaya |
| 2006/0232319 A1 | 10/2006 | Osame et al. |
| 2007/0001740 A1 | 1/2007 | Lin et al. |
| 2007/0008001 A1 | 1/2007 | Sanchez et al. |
| 2007/0046357 A1 * | 3/2007 | Shimizu et al. .............. 327/333 |

OTHER PUBLICATIONS

International Search Report issued on Aug. 5, 2008 in connection with corresponding International Patent Application No. PCT/CA2008/000794.

* cited by examiner

VOLTAGE LEVEL SHIFTER AND BUFFER USING SAME

BACKGROUND OF THE INVENTION

When multiple circuits are used together, it is often the case that the voltage level for a logical "high" varies from circuit to circuit. For example, the value of a parameter called $V_{dd}$ may be representative of a core supply voltage for an Application Specific Integrated Circuit (ASIC) chip. Additionally, the value of a parameter called supply voltage $V_{ddq}$ may be representative of a supply voltage for input/output buffers. Furthermore, the value of a parameter called $V_{DDQ}$ may be representative of a supply voltage to output buffers of a chip.

It is challenging to provide a voltage level shifter allowing for an efficient transition from, for instance, a core power supply voltage of a chip to an output buffer of the chip. Efficiency is often lost to direct current (DC) power consumption. Additionally, delays in signal transition from low to high or high to low can limit the frequency range for which a voltage level shifter is useful.

SUMMARY

An impact of a voltage level shifter with an input transistor pair, a cross-coupled load chain transistor pair and a pair of current sources is that power consumption may be reduced through the use of the cross-coupled load chain transistor pair to minimize the DC current component present in known voltage level shifters. In specific embodiments, feedback elements may be used to minimize delays in signal transitions.

Furthermore, the voltage level shifter may be operated in conjunction with a reference generator to ensure reliable operation as the swing of the input signal voltage changes. The reference generator regulates operational currents of load devices in accordance with changes in the swing of the input signal voltage and, thereby, ensures optimum or nearly optimum current exists in the load, even at the very small values of the voltage swing of the input AC signal. Optionally, source followers may be used as level translating input buffers. Another impact of aspects of the voltage level shifter may be the reduction in quantity of devices relative to competitive voltage level shifters.

In accordance with an example embodiment, there is provided a voltage level shifting circuit. The voltage level shifting circuit includes an input circuit including a pair of input field effect transistors (FETs) of a first polarity, the input circuit receiving a differential input signal and connected between a first supply voltage and a pair of output nodes, and a load chain circuit including a pair of cross-coupled load chain FETs of a second polarity, the load chain circuit receiving a reference voltage and including a pair of regulated current sources, the current sources regulated by the reference voltage, the load chain circuit connected between a second supply voltage and the pair of output nodes.

In accordance with another example embodiment, there is provided a voltage level shifting circuit. The voltage level shifting circuit includes an input circuit configured to receive a differential input signal, the differential input signal varying between a first high level and a first low level and received at: a first input field effect transistor (FET); and a second input FET, having the same polarity as the first input FET. The voltage level shifting circuit also includes a load chain circuit configured to receive a reference voltage, the load chain circuit including: a first load chain FET of opposite polarity to the first input FET; a second load chain FET of opposite polarity to the second input FET; the first load chain FET cross-coupled to the second load chain FET such that a drain of the first load chain FET is connected to a gate of the second load chain FET and the drain of the second load chain FET is connected to a gate of the first load chain FET; a first regulated current source configured to receive the reference voltage and regulate a current in the first regulated current source based on the reference voltage; and a second regulated current source configured to receive the reference voltage and regulate a current in the second regulated current source based on the reference voltage. An input current in the input FETs is controlled based on the input signal in combination with the reference signal to produce an output signal at output nodes positioned between the load chain circuit and the input circuit, such that the output signal varies between a second high level and a second low level, where the second high level is shifted relative to the first high level and the second low level is shifted relative to the first low level.

In accordance with a further example embodiment, there is provided a voltage level shifting circuit. The voltage level shifting circuit includes a first supply voltage, a second supply voltage, a first input node configured to receive a first input signal and a second input node configured to receive a second input signal, where the first input signal and the second input signal, when taken together, form a differential input signal having an input voltage swing between a lower level and a higher level. The voltage level shifting circuit also includes a first output node, a second output node, a reference voltage node, a first input field effect transistor (FET) with a source connected to the first supply voltage and a gate connected to the first input node and a second input FET, having the same polarity as the first input FET, with a source connected to the first supply voltage and a gate connected to the second input node. The voltage level shifting circuit also includes a first load chain FET of opposite polarity to the first input FET, a drain of the first load chain FET connected to a drain of the first input FET and connected to the first output node, a second load chain FET of opposite polarity to the second input FET, a drain of the second load chain FET connected to a drain of the second input FET and connected to the second output node, the first load chain FET cross-coupled to the second load chain FET such that the drain of the first load chain FET is connected to a gate of the second load chain FET and the drain of the second load chain FET is connected to a gate of the first load chain FET, a first regulated current source connected between a source of the first load chain FET and the second supply voltage, current in the first regulated current source being regulated by a reference voltage received at the reference voltage node, and a second regulated current source connected between a source of the second load chain FET and the second supply voltage, current in the second regulated current source being regulated by the reference voltage received at the reference voltage node.

In accordance with a still further example embodiment, there is provided a method of shifting a voltage level of an input signal. The method includes receiving a differential input signal at an input circuit, the input circuit including a pair of input field effect transistors (FETs) of a first polarity, the differential input signal varying between a first high level and a first low level, receiving a reference voltage at a load chain circuit, the load chain circuit including a pair of cross-coupled load chain FETs of a second polarity, the load chain circuit also and including a pair of regulated current sources, the current sources regulated by the reference voltage, the load chain circuit connected between a second supply voltage and a pair of output nodes, and producing an output signal at the output nodes, wherein the output signal varies between a second high level and a second low level, where the second high level is shifted relative to the first high level and the second low level is shifted relative to the first low level.

BRIEF DESCRIPTION OF THE DRAWINGS

Reference will now be made to the drawings, which show by way of example, embodiments of the invention, and in which.

DETAILED DESCRIPTION OF THE EMBODIMENTS

Figure 1:
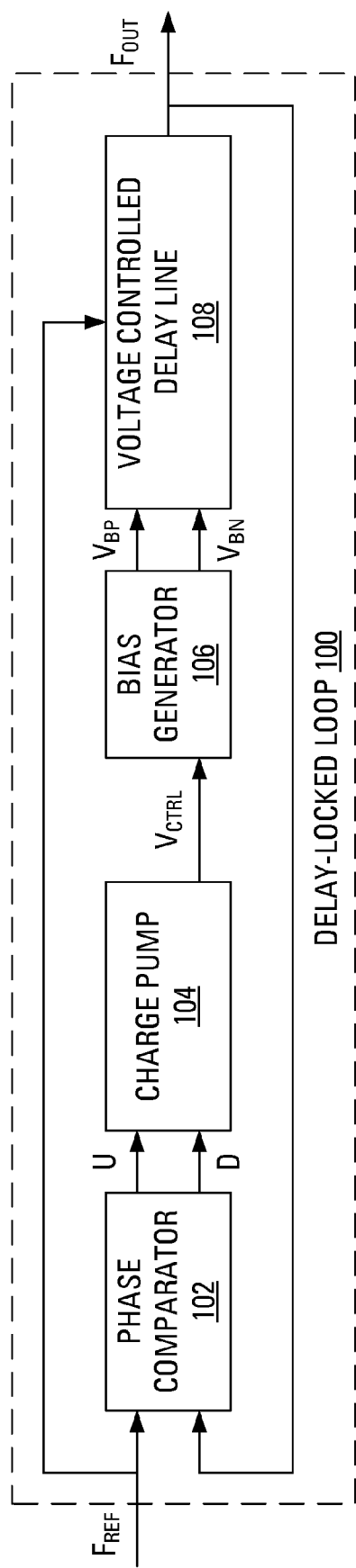
FIG. 1 shows a block diagram of a typical delay-locked loop including a voltage controlled delay line.

FIG. 1 presents a schematic illustration of a typical delay-locked loop (DLL) 100 as presented in John G. Maneatis, "Low-Jitter Process-Independent DLL and PLL Based on Self-Biased Technique", IEEE JSSC VOL. 31, No 11, November 1996, pp. 1723-1732 (hereinafter "Maneatis"). Maneatis indicates that a self-biased DLL is constructed by taking advantage of the control relationship offered by a typical DLL. The typical DLL 100 includes a phase comparator 102, a charge pump 104, a loop filter, a bias generator 106 and voltage controlled delay line (VCDL) 108. The negative feedback in the loop adjusts the delay through the VCDL 108 by integrating the phase error that results between a periodic reference input, $F_{REF}$, and output, $F_{OUT}$, from the VCDL 108. Once in lock, the VCDL 108 will delay the reference input, $F_{REF}$, by a fixed amount to form the VCDL output such that there is no detected phase error between $F_{REF}$ and $F_{OUT}$.

In operation, the phase comparator 102 receives the AC reference signal, $F_{REF}$, and the AC output signal, $F_{OUT}$, and generates a DC correction signal indicative of a phase difference between $F_{REF}$ and $F_{OUT}$. Dependent upon whether $F_{OUT}$ is leading or lagging $F_{REF}$, the DC correction signal will be output on an "Up" line ("U") or a "Down" ("D") line of the phase comparator 102. Both the Up line and the Down line are received by the charge pump 104. The charge pump 104 receives the DC correction signal and provides, as output, a control signal with a level called $V_{CTRL}$. The control signal is received by the bias generator 106, whose output is a bias voltage, $V_{BP}$, for PMOS transistors and a bias voltage, $V_{BN}$, for NMOS transistors. The two bias voltages, along with the AC reference signal, $F_{REF}$, are received by the voltage controlled delay line 108. The output of the voltage controlled delay line 108 is the AC output signal, $F_{OUT}$.

Figure 2:
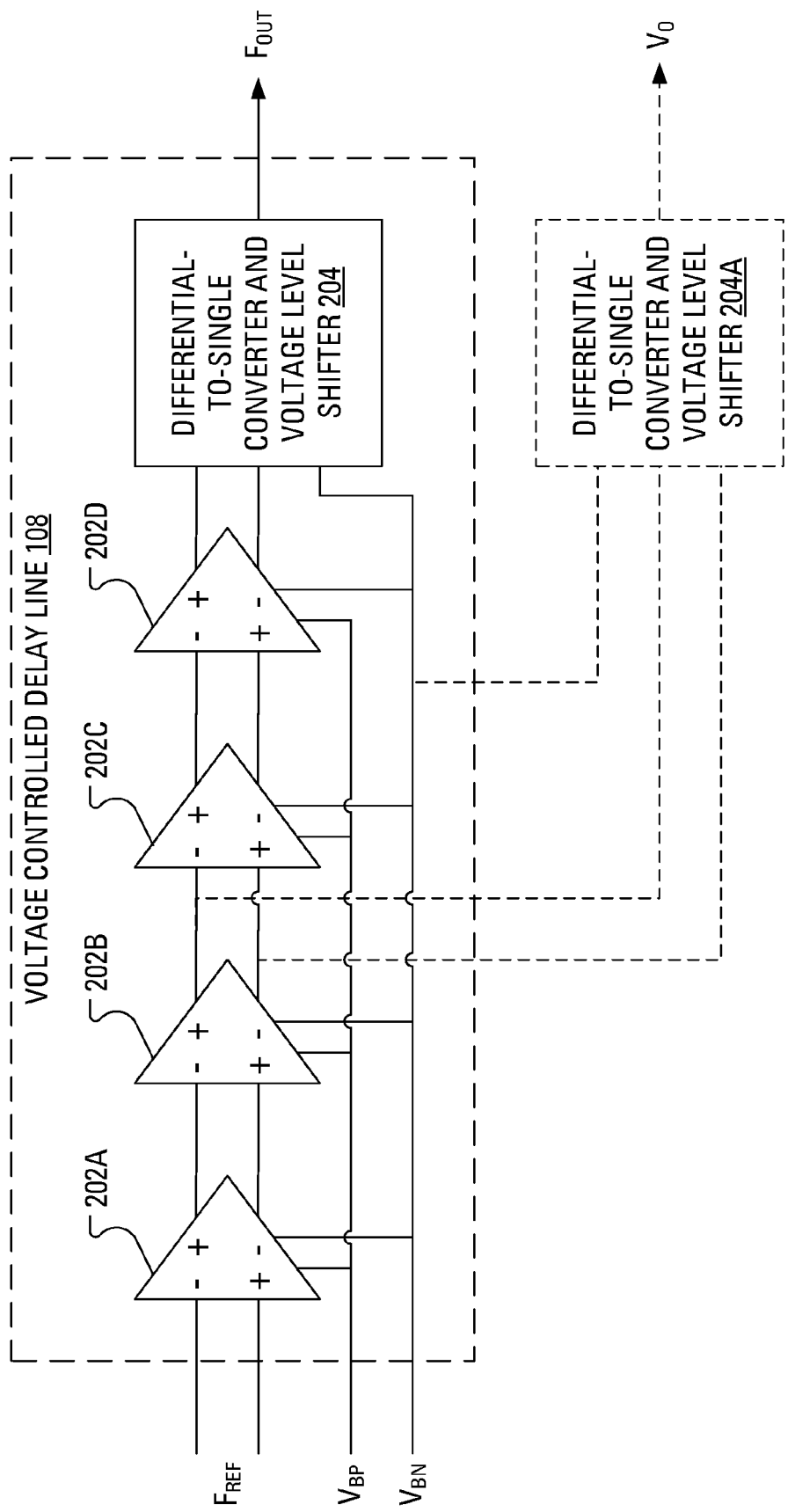
FIG. 2 schematically illustrates an example structure for the voltage controlled delay line of FIG. 1, the example structure includes a differential-to-single converter and voltage level shifter.

FIG. 2 schematically illustrates an example structure for the VCDL 108. In particular, the VCDL 108 includes multiple delay elements 202A, 202B, 202C, 202D (individually or collectively, 202) connected in a series that is terminated in a differential-to-single converter and voltage level shifter 204. The differential input to the first delay element 202A is the reference signal, $F_{REF}$. The differential output of the first delay element 202A is received as differential input to the second delay element 202B. The differential output of the second delay element 202B is received as differential input to the third delay element 202C. The differential output of the third delay element 202C is received as differential input to the fourth delay element 202D. The differential output of the fourth delay element 202D is received as differential input to the differential-to-single converter and voltage level shifter 204. Each of the delay elements 202 receives bias voltages $V_{BN}$ and $V_{BP}$ from the bias generator 106. Additionally, the differential-to-single converter and voltage level shifter 204 receives bias voltage $V_{BN}$ from the bias generator 106. Notably, the example structure of FIG. 2 includes four delay elements 202 while, generally, the number of delay elements 202 is a design consideration and the number of delay elements 202 is in no way is limited. Indeed, the number of delay elements 202 may range from as few as one to as many as are deemed necessary.

Traditionally, voltage controlled delay lines have suffered from degradations related to the process used to manufacture the transistors employed therein and degradations related to variability in operation conditions. Maneatis suggested the bias generator 106 to provide the bias voltages $V_{BP}$ and $V_{BN}$ and, by doing so, proposed to eliminate much of the process-related degradations as well as degradations related to variability in operation conditions.

Figure 3:
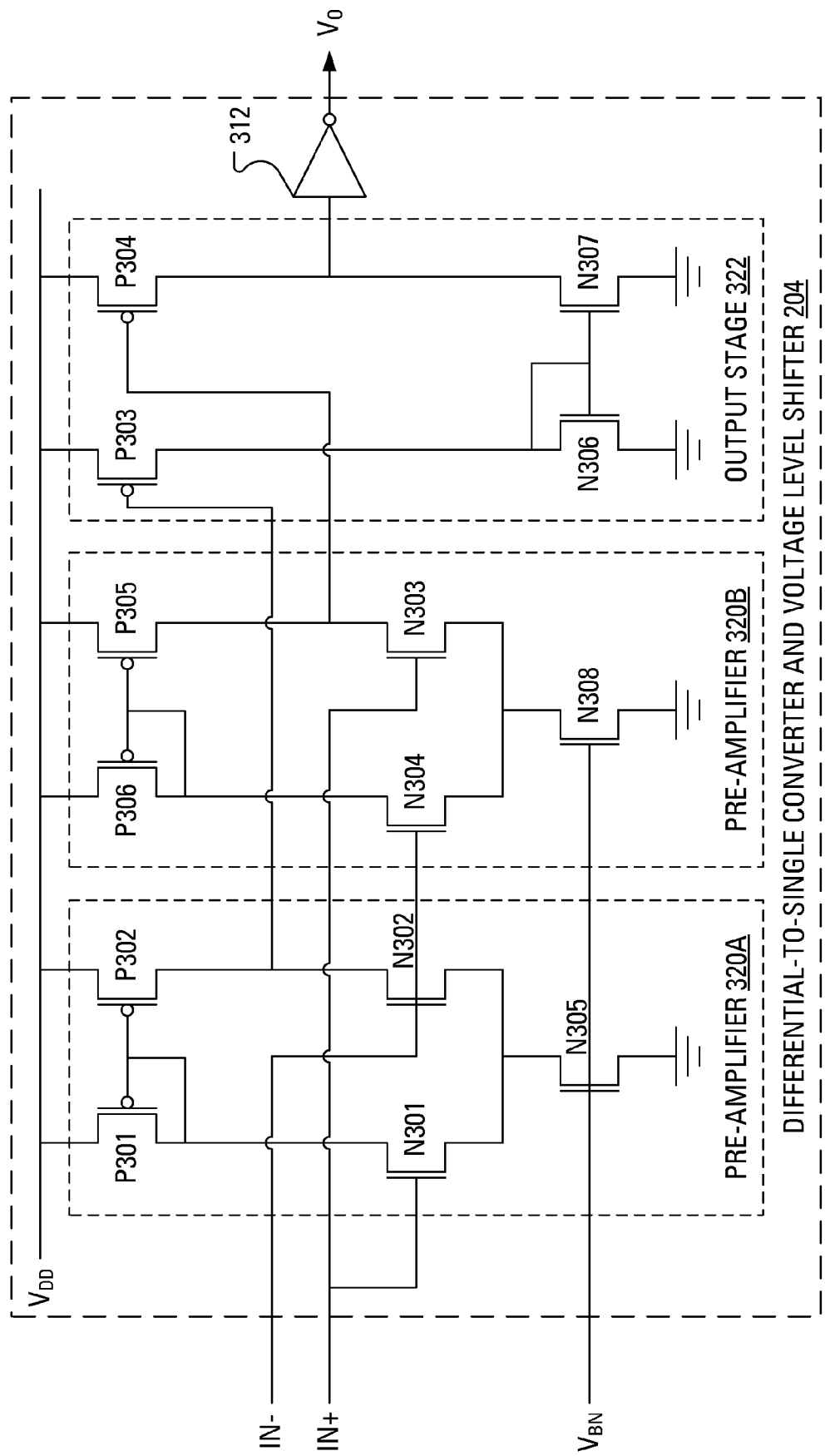
FIG. 3 illustrates a prior art structure for the differential-to-single converter and voltage level shifter of FIG. 2.

Maneatis notes that the AC signal in the VCDL 108 has a variable voltage swing, which changes with the frequency of the AC signal (corresponding to delay produced by the delay line). The differential-to-single converter and voltage level shifter 204 proposed in Maneatis transforms a differential, limited-swing signal into a full-swing signal. As illustrated in FIG. 3, the differential-to-single converter and voltage level shifter 204 includes an input stage having two identical differential pre-amplifiers.

A first differential pre-amplifier 320A includes a differentially coupled transistor pair, which transistor pair includes a first NMOS transistor N301 and a second NMOS transistor N302, a first DC current source NMOS transistor N305 and a first current mirror load including a first PMOS transistor P301 and a second PMOS transistor P302.

In particular, the gate of the first NMOS transistor N301 receives positive differential input (IN+), while the gate of the second NMOS transistor N302 receives negative differential input (IN−). The source of the first NMOS transistor N301 and the source of the second NMOS transistor N302 are connected to each other and to the drain of the first DC current source NMOS transistor N305. The source of the first DC current source NMOS transistor N305 is connected to ground and the gate receives bias voltage $V_{BN}$. The drain of the first NMOS transistor N301 is connected to the drain of the first PMOS transistor P301. The drain of the second NMOS transistor N302 is connected to the drain of the second PMOS transistor P302. The first load is formed as a current mirror through the connection of the gate of the first PMOS transistor P301 to the gate of the second PMOS transistor P302 and to the drain of the first PMOS transistor P301. The source of the first PMOS transistor P301 and the source of the second PMOS transistor P302 are connected to a $V_{CC}$ supply voltage.

A second differential pre-amplifier 320B includes differentially coupled transistor pair, which transistor pair includes a third NMOS transistor N303 and a fourth NMOS transistor N304, a second DC current source NMOS transistor N308 and a second load current mirror including a third PMOS transistor P305 and a fourth PMOS transistor P306.

In particular, the gate of the third NMOS transistor N303 receives positive differential input (IN+), while the gate of the fourth NMOS transistor N304 receives negative differential input (IN−). The source of the third NMOS transistor N303 and the source of the fourth NMOS transistor N304 are connected to each other and to the drain of the second DC current source NMOS transistor N308. The source of the second DC current source NMOS transistor N308 is connected to ground and the gate receives bias voltage $V_{BN}$. The drain of the third NMOS transistor N303 is connected to the drain of the third PMOS transistor P305. The drain of the fourth NMOS transistor N304 is connected to the drain of the fourth PMOS transistor P306. The second load is formed as a current mirror through the connection of the gate of the third PMOS transistor P305 to the gate of the fourth PMOS transistor P306 and to the drain of the fourth PMOS transistor P306. The source of the third PMOS transistor P305 and the source of the fourth PMOS transistor P306 are connected to a $V_{CC}$ supply voltage.

The differential-to-single converter and voltage level shifter 204 proposed in Maneatis also includes an output stage 322 with a fifth PMOS transistor P303 paired with a sixth PMOS transistor P304 and, further, a current mirror is included, which current mirror is formed by a fifth NMOS transistor N306 and a sixth NMOS transistor N307.

In particular, the gate of the fifth PMOS transistor P303 receives a signal present at the connection between the drain of the second NMOS transistor N302 and the second PMOS transistor P302. Similarly, the gate of the sixth PMOS transistor P304 receives a signal present at the connection between the drain of the third NMOS transistor N303 and the third PMOS transistor P305. The source of the fifth PMOS transistor P303 and the source of the sixth PMOS transistor P304 are connected to a $V_{CC}$ supply voltage. The drain of the fifth PMOS transistor P303 is connected to the drain of the fifth NMOS transistor N306. The drain of the sixth PMOS transistor P304 is connected to the drain of the sixth NMOS transistor N307. A current mirror is formed by connecting the gate of the fifth NMOS transistor N306 to the gate of the sixth NMOS transistor N307 and to the drain of the fifth NMOS transistor N306. The source of the fifth NMOS transistor N306 and the source of the sixth NMOS transistor N307 are connected to ground.

A signal is taken from the connection between the drain of the sixth NMOS transistor N307 and the drain of the sixth PMOS transistor P304 and inverted at an inverter 312 to form the single output voltage, $V_O$, of the differential-to-single converter and voltage level shifter 204.

Notably, a differential-to-single converter and voltage level shifter may "tap" the differential output of any one of the delay elements 202, as shown in FIG. 3 as an optional differential-to-single converter and voltage level shifter 204A.

Figure 4A:
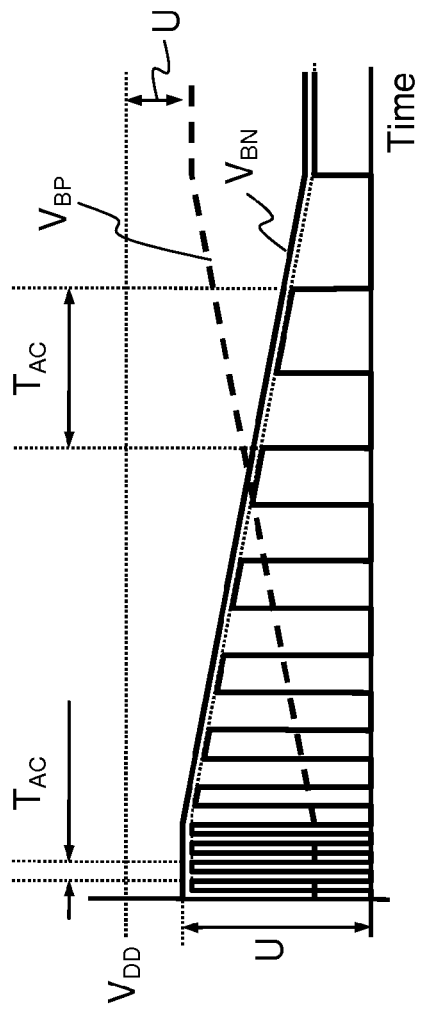
FIG. 4A illustrates voltage waveforms of the differential-to-single converter and voltage level shifter of FIG. 3.

Voltage waveforms input to the differential-to-single converter and voltage level shifter 204 are shown in a simplified form in FIG. 4A. AC signal voltage swing in this, first, example is from a higher voltage level of the supply voltage $V_{DD}$ to a lower voltage level. The lower voltage level closely follows the bias voltage $V_{BP}$. As the AC signal frequency decreases, the bias voltage $V_{BP}$ increases and the bias voltage $V_{BN}$ decreases correspondingly. A decrease in the AC signal frequency corresponds to an increase in the delay provided by the VCDL 108, a longer AC signal period, $T_{AC}$, and a decrease in the AC voltage swing. Range of swing variation over an operational frequency range for this kind of delay line may be hundreds of millivolts, that is, from 20-30% to almost 100% of the value of the supply voltage $V_{DD}$.

Figure 4B:
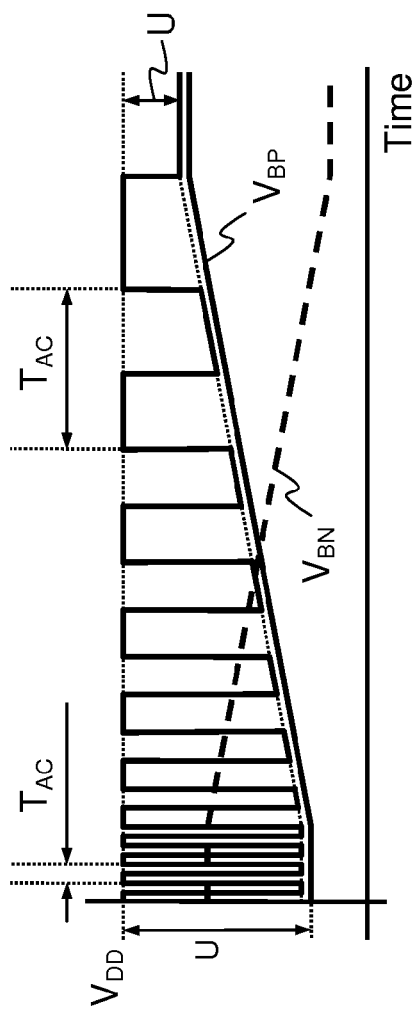
FIG. 4B illustrates inverted-polarity voltage waveforms of the differential-to-single converter and voltage level shifter of FIG. 3.

An input waveform is shown in FIG. 4B from an "inverted polarity" version of the delay elements 202. If the delay elements 202 are built with PMOS transistors in place of NMOS transistors and with NMOS transistors in place of PMOS transistors, it is anticipated that the AC signal voltage swing will be from a lower voltage level of the supply voltage $V_{SS}$ to a higher voltage level close to the bias voltage $V_{BN}$. A decrease in the frequency of the AC signal corresponds to a longer AC signal period, $T_{AC}$, and to a decrease in the AC voltage swing. The correspondence between a decrease in the frequency of the AC signal and a decrease in the AC voltage swing is found in the example waveforms in both FIG. 4A and FIG. 4B.

For the differential-to-single converter and voltage level shifter 204 of FIG. 3, DC current consumption increases as the AC signal frequency increases. If the VCDL 108 is used in a DLL and the DLL is held near the maximum operation frequency (e.g., during reset), then the quiescent current of differential-to-single converter and voltage level shifter 204 is expected to surge. Indeed, the quiescent current of differential-to-single converter and voltage level shifter 204 may overload the power supply associated with the circuit. The problem is especially acute when multiple optional differential-to-single converter and voltage level shifters 204A are used to tap partially delayed versions of the AC signal along the delay line.

In another problematic feature of the differential-to-single converter and voltage level shifter 204 of FIG. 3, at lower AC signal frequencies, the voltage swing in the delay elements 202, which voltage swing we can represent with the character "U", changes with an approximate rate of 1/U vs. delay. When voltage swing in the delay line is close to the threshold voltage, $V_T$, of the MOS transistors in use, the currents in the output stage 322 of the differential-to-single converter and voltage level shifter 204 of FIG. 3 may be just a few microamperes. This may cause a failure of the differential-to-single converter and voltage level shifter 204 at lower frequencies, even though the delay elements 202 are still capable of passing the AC signal. This potential for failure effectively shrinks the frequency range of any system in which the differential-to-single converter and voltage level shifter 204 is used. An example such system is the DLL 100 of FIG. 1. As will be understood by a person of ordinary skill in this art, a phase-locked loop (PLL) is another example system in which a VCDL employing the differential-to-single converter and voltage level shifter 204 may be used.

Yet another problem stems from use of current mirrors in all three stages 320A, 320B, 322. The AC signal is expected to alter currents in the current mirrors between very low levels (often less than one microampere) and maximum levels. Since it takes time for current mirrors to restore functionality in a transition from low current to nominal operational current, the differential-to-single converter and voltage level shifter 204 is characterized by relatively long delay times.

One more problem is relates to scheme complexity. Because there are three stages in the differential-to-single converter and voltage level shifter 204, even though the stages are simple, the device count in this scheme is relatively high (14 transistors) and the AC signal path is relatively long. Correcting this problem requires the AC signal propagation delay to increase through the differential-to-single converter and voltage level shifter 204 even further and requires relatively larger area on the chip.

Figure 5:
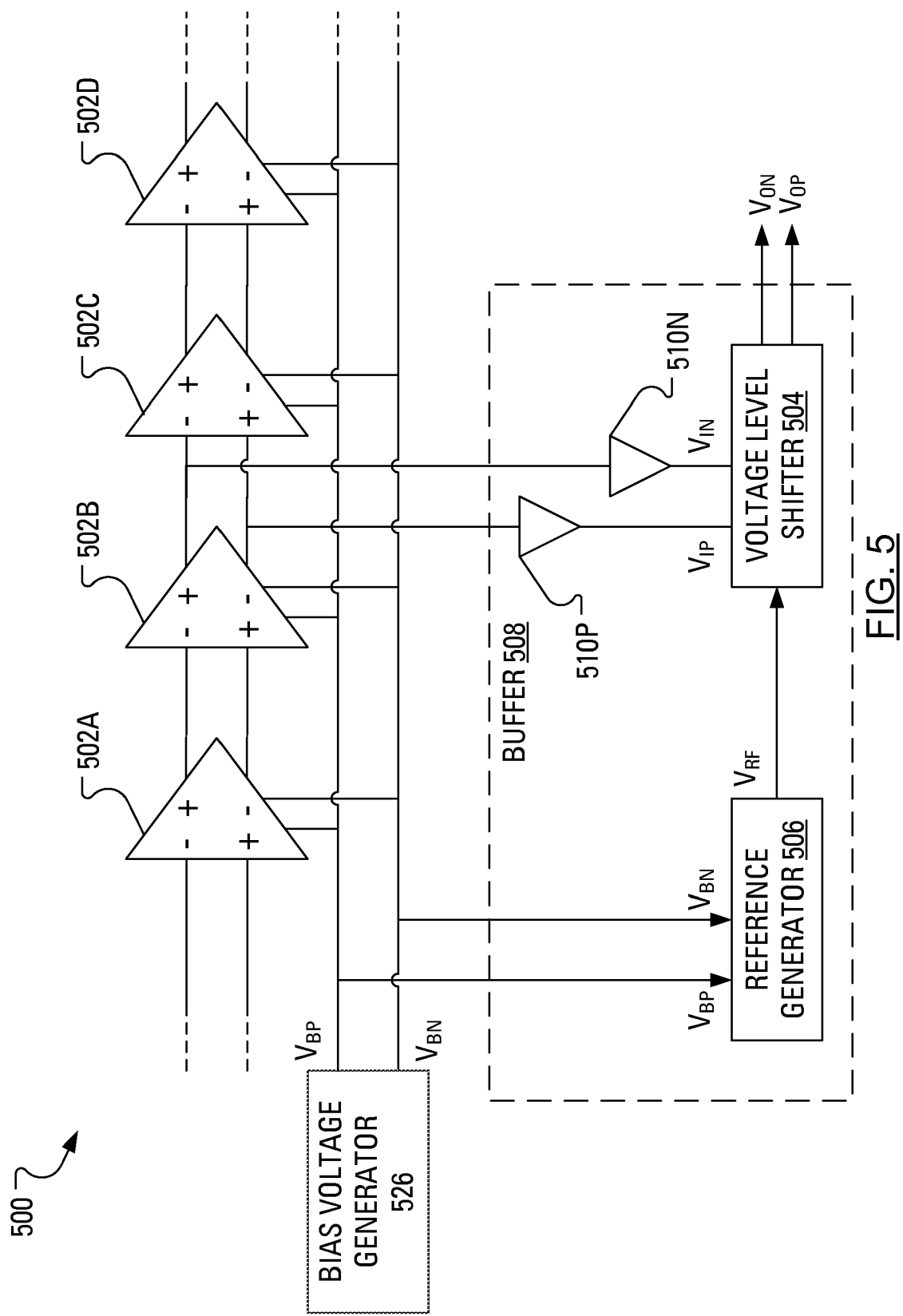
FIG. 5 illustrates an application for a voltage level shifter according to an example embodiment, the voltage level shifter operating in conjunction with a reference generator.

An example of an application scheme 500 for a buffer 508 that includes a novel voltage level shifter 504 is presented in FIG. 5. In some configurations, such as those presented in FIGS. 6-10 and variations, the novel voltage level shifter 504 of FIG. 5 may be considered a differential-to-single converter and voltage level shifter 504 for use in applications wherein the differential-to-single converter and voltage level shifter 204 of FIG. 2 has been useful. The scheme 500 includes an example delay line including a first delay element 502A, a second delay element 502B, a third delay element 502C and a fourth delay element 502D (collectively or individually 502) connected in series in the manner of the delay elements 202 of FIG. 2. The example delay line can be a part of, or the entirety of, a delay line used in a DLL, a vernier delay circuit or be a part of, or the entirety of, a Voltage Controlled Oscillator in a Phase-locked Loop. In common with the delay elements 202 of FIG. 2, the delay produced by each of the delay elements 502 is controlled, according to known self-biasing techniques, by bias voltages $V_{BN}$ and $V_{BP}$. The bias voltages $V_{BN}$ and $V_{BP}$ are produced by a bias voltage generator 526. Notably, the example structure of FIG. 5 includes four delay elements 502 while, generally, the number of delay elements 502 is a design consideration and the number of delay elements 502 is in no way is limited. Indeed, the number of delay elements 502 may range from as few as one to as many as are deemed necessary.

As illustrated in FIG. 5, the example delay line is tapped at a tapping point between the second delay element 502B and the third delay element 502C. A first differential signal from the tapping point is received, in the buffer 508, by a first input buffer 510P and a second differential signal from the tapping point is received by a second input buffer 510N. Output from the first input buffer 510P is received at a first differential input terminal $V_{IP}$ of the voltage level shifter 504. Similarly, output from the second input buffer 510N is received as a second differential input terminal $V_{IN}$ of the voltage level shifter 504. Additionally, the voltage level shifter 504 receives, at a reference voltage terminal, a reference voltage $V_{RF}$ from a reference generator 506. The reference generator 506 generates a reference voltage, $V_{RF}$, based on one of, or a combination of, the bias voltages $V_{BN}$ and $V_{BP}$ provided by the bias voltage generator 526.

Figure 6:
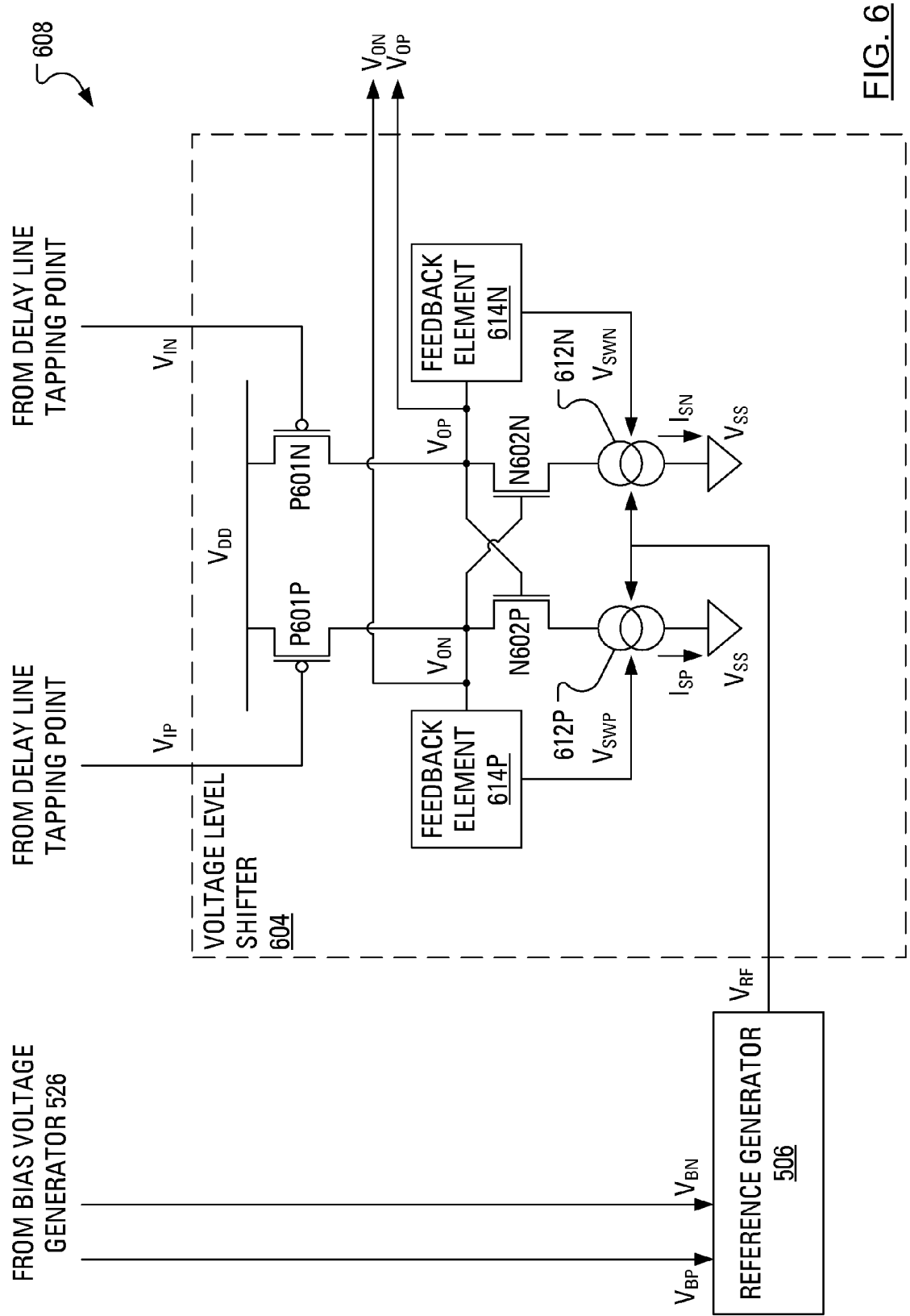
FIG. 6 illustrates details of the voltage level shifter of FIG. 5 according to example embodiments.

A buffer 608 is illustrated in FIG. 6 as including a non-specific voltage level shifter 604. The buffer 608 of FIG. 6 is generally consistent with the buffer 508 of FIG. 5, however, the buffer 608 of FIG. 6 omits structures consistent with the input buffers 510P, 510N. The non-specific voltage level shifter 604 has a first input PMOS transistor P601P and a second input PMOS transistor P601N. The non-specific voltage level shifter 604 also has a load chain, which load chain comprises a pair of transistors that have an opposite polarity to the input transistors. The load chain transistors include a first NMOS load chain transistor N602P and a second NMOS load chain transistor N602N. The drain of the first NMOS load chain transistor N602P is connected to the drain of the first PMOS transistor P601P, the gate of the second NMOS load chain transistor N602N and a the input of a first feedback element 614P. The drain of the second NMOS load chain transistor N602N is connected to the drain of the second PMOS transistor P601N, the gate of the first NMOS load chain transistor N602P and the input of a second feedback element 614N. That is, the first NMOS load chain transistor N602P and the second NMOS load chain transistor N602N are cross-coupled.

The load chain also includes a first regulated current source 612P, which is connected between the source of the first NMOS load chain transistor N602P and a supply voltage $V_{SS}$, and a second regulated current source 612N, which is connected between the source of the second NMOS load chain transistor N602N and the supply voltage $V_{SS}$. The current of the first regulated current source 612P is controlled by the reference voltage $V_{RF}$ received at a reference voltage terminal and by a first feedback signal, $V_{SWP}$. The reference voltage $V_{RF}$ is produced by the reference generator 506. The first feedback signal $V_{SWP}$ is produced by the first feedback element 614P. The current of the second regulated current source 612N is controlled by the reference voltage $V_{RF}$ and by a second feedback signal, $V_{SWN}$, produced by the second feedback element 614N.

In overview, the non-specific voltage level shifter 604 has the pair of input PMOS transistors P601P, P601N and a pair of load chains, each including one of the cross-coupled NMOS load chain transistors N602P, N602N and one of the regulated current sources 612P, 612N. The currents of the regulated current sources 612P, 612N may be controlled, in part, by the reference voltage $V_{RF}$, produced by the reference generator 506, the first feedback signal $V_{SWP}$, produced by the first feedback element 614P, and the second feedback signal $V_{SWN}$, produced by the second feedback element 614N.

The reference generator 506 produces the reference voltage $V_{RF}$ that is used by the regulated current sources 612P, 612N so that currents in the load chains are maintained proportional to maximum currents produced by the input PMOS transistors P601P, P6001N and responsive to the change of the maximum currents caused by change of the input signal voltage swing, U. The reference generator 506 may, when producing the reference voltage $V_{RF}$, use bias voltages $V_{BN}$ and $V_{BP}$, which are produced by the bias voltage generator 526 and are correlated to the swing U, on which depends the maximum current produced by the input PMOS transistors P601P, P601N.

The extremes of the voltage swing in the example delay line signal are the supply voltage $V_{DD}$ and a voltage close to the bias voltage $V_{BP}$. As the value of the bias voltage $V_{BP}$ changes (to provide a variable delay in the delay line), the lower level of the voltage swing U also changes. The change in the lower level of the voltage swing U, in turn, causes a change in the maximum current that the input PMOS transistors P601P, P601N can produce. At the lower level of the voltage swing U, the gate voltage for a given one of the input PMOS transistors P601P, P601N is the bias voltage $V_{BP}$. It follows then, that, at the lower level of the voltage swing U, the gate-source voltage for the given one of the input PMOS transistors P601P, P601N is equal to $V_{DD}-V_{BP}$ and is relatively lower.

While the cross-coupled NMOS load chain transistors N602P, N602N beneficially reduce DC current consumption in the non-specific voltage level shifter 604, the cross-coupled NMOS load chain transistors N602P, N602N also introduce some hysteresis, that is, a delay in switching the voltage on output terminals $V_{ON}$ and $V_{OP}$ responsive to a switch occurring on the differential input terminals $V_{IP}$ and $V_{IN}$.

It should be understood that if the maximum current of the input PMOS transistors P601P, P601N is less than the current in the cross-coupled NMOS load chain transistors N602P, N602N, the switching will not happen. A given one of the NMOS load chain transistors N602P, N602N will simply be unable to overpull the load chain and flip the output. For this reason, the strength of the load chain devices is restricted through the use of the regulated current sources 612P, 612N. The strength of the regulated current sources 612P, 612N is, in turn, coordinated with the strength of the input PMOS transistors P601P, P601N. An optimized coordination (a properly designed reference generator 506) will minimize the influence of hysteresis, meaning the load chain will appropriately flip the value on the output terminal in all conditions and delay caused by hysteresis will be minimized.

In operation, the voltage level shifter 504 transforms a differential limited-swing (e.g., from the supply voltage $V_{DD}$ to the bias voltage $V_{BP}$) AC signal, which is received at the differential input terminals $V_{IP}$ and $V_{IN}$ connected to tapping points in the example delay line, into a differential full-swing (e.g., from the supply voltage $V_{DD}$ to the supply voltage $V_{SS}$) AC signal at output terminals, identified as $V_{ON}$ and $V_{OP}$. For the sake of simplicity, it is assumed that the self-biased system comprising the delay elements 502 and the bias voltage generator 526 operates so that an AC signal in the delay line (at the tapping points) is characterized by a voltage swing U from the supply voltage $V_{DD}$ down to a voltage level very close to the bias voltage $V_{BP}$.

When the input terminal $V_{IN}$ is at the lower level (close to the bias voltage $V_{BP}$, in the current example) and the input terminal $V_{IP}$ is at the higher level (the supply voltage $V_{DD}$, the current example), the output terminal $V_{OP}$ is at the supply voltage $V_{DD}$ and the output terminal $V_{ON}$ is at the supply voltage $V_{SS}$. In particular, since the gate ($V_{IN}$) of the second input PMOS transistor P601N is at a low voltage, the second input PMOS transistor P601N is ON. In contrast, since the gate ($V_{IP}$) of the first input PMOS transistor P601P is at a high voltage, the second input PMOS transistor P601N is OFF. Since the gate of the first NMOS load chain transistor N602P is directly connected to the output terminal $V_{OP}$ and the output terminal $V_{OP}$ is at a high voltage, the first NMOS load chain transistor N602P is ON and the voltage at the output terminal $V_{ON}$ is allowed to take on a value close to the supply voltage $V_{SS}$. In contrast, since the gate of the second NMOS load chain transistor N602N is at a low voltage ($V_{ON}=V_{SS}$), the second NMOS load chain transistor N602N is OFF.

The output terminal $V_{ON}$ is held down to the supply voltage $V_{SS}$ by the drive of the load chain including the first NMOS load chain transistor N602P and the first regulated current source 612P. After a transition on the output terminal $V_{ON}$ is finished, a small amount of current will suffice to hold the voltage on the output terminal $V_{ON}$ down. Accordingly, the current in the first NMOS load chain transistor N602P and the first regulated current source 612P can be reduced. This reduction, in turn, can be shown to help to make the rising voltage transition on the output terminal $V_{ON}$ faster, since the first input PMOS transistor P601P now has less of the drive of the load chain to over-pull.

When the input terminal $V_{IP}$ is at the lower level (close to the bias voltage $V_{BP}$, in this example) and the input terminal $V_{IN}$ is at the higher level (the supply voltage $V_{DD}$, in this example), the output terminal $V_{ON}$ is at the supply voltage $V_{DD}$ and the output terminal $V_{OP}$ is at the supply voltage $V_{SS}$.

In particular, since the gate ($V_{IP}$) of the first input PMOS transistor P601P is at a lower level, the first input PMOS transistor P601P is ON. In contrast, since the gate ($V_{IN}$) of the second input PMOS transistor P601N is at a high voltage, the second input PMOS transistor P601N is OFF. Since the gate of the second NMOS load chain transistor N602N is directly connected to the output terminal $V_{ON}$ and the output terminal $V_{ON}$ is at a high voltage, the second NMOS load chain transistor N602N is ON and the voltage at the output terminal $V_{OP}$ is allowed to take on a value close to the supply voltage $V_{SS}$.

In contrast, since the gate of the first NMOS load chain transistor N602P is at a low voltage ($V_{OP}=V_{SS}$), the first NMOS load chain transistor N602P is OFF.

The output terminal $V_{OP}$ is held down to the supply voltage $V_{SS}$ by the drive of the load chain including the second NMOS load chain transistor N602N and the second regulated current source 612N. After a transition on output terminal $V_{OP}$ is finished, a small amount of current will suffice to hold the voltage on the output terminal $V_{OP}$ down. Accordingly, the current in the second NMOS load chain transistor N602N and the second regulated current source 612N can be reduced. This reduction, in turn, can be shown to help to make the rising voltage transition on the output terminal $V_{OP}$ faster, since the second input PMOS transistor P601N now has less of the drive of the load chain to over-pull.

The first feedback element 614P produces a first feedback signal, $V_{SWP}$, indicative of the state of the output terminal $V_{ON}$. Consequently, as the state of the output terminal $V_{ON}$ changes, the value of the current through the first regulated current source 612P, $I_{SP}$, changes. The first feedback element 614P is characterized by a predetermined delay between the time when the state of $V_{ON}$ changes and the time when the value of the first feedback signal $V_{SWP}$ changes. The second feedback element 614N produces a second feedback signal, $V_{SWN}$, indicative of the state of the output terminal $V_{OP}$. Consequently, as the state of the output terminal $V_{OP}$ changes, the value of the current through the second regulated current source 612N, $I_{SN}$, changes. The second feedback element 614N is characterized by a predetermined delay between time when the state of $V_{OP}$ changes and the time when the value of the second feedback signal $V_{SWN}$ changes.

The current, $I_{SP}$, produced in the first regulated current source 612P may be arranged to have two components. A first component, a nominal value, is determined by the voltage level of the reference voltage $V_{RF}$ output from the reference generator 506. A second component is determined by the voltage level of the first feedback signal $V_{SWP}$ output from the first feedback element 614P. In a similar manner, the current, $I_{SN}$, produced in the second regulated current source 612N may also be arranged to have two components. A first component, a nominal value, is determined by the voltage level of the reference voltage, $V_{RF}$, output from the reference generator 506. A second component is determined by the voltage level of the second feedback signal $V_{SWN}$ output from the second feedback element 614N. As the value of the first feedback signal $V_{SWP}$ and the value of the second feedback signal $V_{SWN}$ change, the second component of the corresponding current $I_{SP}$ and $I_{SN}$ also changes. The contributions, to the overall $I_{SP}$ and $I_{SN}$ currents, of the second current components are smaller than the contributions of the first current components.

Alternatively, both the first components and the second components of the currents $I_{SP}$ and $I_{SN}$ may depend on the reference voltage value $V_{RF}$ and, then, the entirety of each current is divided into the two parts (components). In such a scenario, the first part (always present in the $I_{SN}$ current and the $I_{SP}$ current) is a fixed portion of the overall $I_{SN}$ and $I_{SP}$ current and the second part (switched on or off according to the states of the $V_{OP}$ and $V_{ON}$ outputs) is the remaining portion of the overall $I_{SN}$ and $I_{SP}$ current.

A person of ordinary skill in the art will appreciate that the first input buffer 510P and the second input buffer 510N are optional. Furthermore, it should be clear that the input buffers 510P, 510N could be replaced with other circuits, such as amplifiers or repeaters.

The first input buffer 510P and the second input buffer 510N (or amplifiers or repeaters), when used, may provide an increased voltage swing or may move both the higher extreme and the lower extreme of the swing by a voltage difference. In the example arrangement of FIG. 6, the higher extreme may be less than the supply voltage $V_{DD}$ by $V_T$, where $V_T$ is the threshold voltage of the input PMOS transistors P601P, P601N. Similarly, the lower extreme may be less than the bias voltage $V_{BP}$ by $V_T$. Where $V_T$ is the threshold voltage of the input PMOS transistors P601P, P601N. Notably, in general $V_T$ can be many other kinds of voltage differences, for example, $V_T$ can be an NMOS threshold or a threshold difference or a compensated/stabilized voltage difference, dependent upon on complexity of the first input buffer 510P and the second input buffer 510N.

Such a reduction of the swing extremes causes the input PMOS transistors P601P, P601N to be closer to their ON state (with their gate-source voltages close to $V_T$) when the input terminals $V_{IP}$ and $V_{IN}$ are at their higher extremes and have $V_T$ more of gate-source voltage when the input terminals $V_{IP}$ and $V_{IN}$ are at their lower extremes. This closer proximity to the ON state effectively increases the drive of the input PMOS transistors P601P, P601N and can be shown to shorten the AC signal propagation delay through the non-specific voltage level shifter 604.

As an aside, the bias voltage generator 526 can also produce a reference signal indicative of the maximum currents at the differential input terminals $V_{IP}$ and $V_{IN}$, for instance, by mimicking a portion of the delay line with one input permanently wired to one state, effectively taking a function of the bias voltage generator 526.

Figure 7:
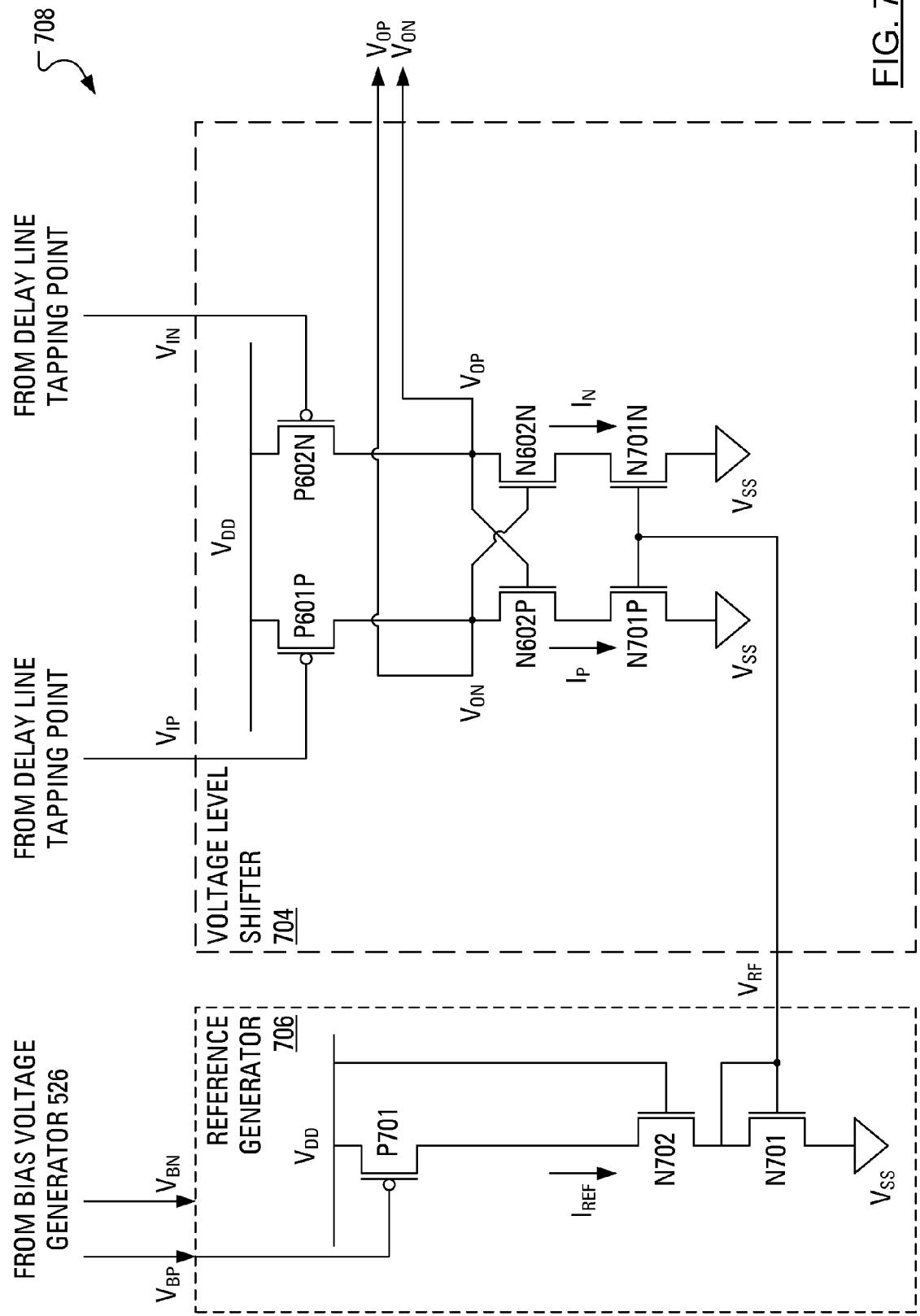
FIG. 7 illustrates details of the voltage level shifter and the reference generator of FIG. 5 according to an example embodiment.

A first possible implementation 704 of the non-specific voltage level shifter 604 of FIG. 6 in combination with a first possible implementation 706 of the reference generator 506 of FIGS. 5 and 6 are illustrated together in FIG. 7 as forming a buffer 708. Notably absent from the first voltage level shifter implementation 704 are implementations of the feedback elements 614P, 614N. A person of ordinary skill will appreciate that such feedback elements are not always necessary for the voltage level shifter 504 to achieve the goal of transforming a differential limited-swing AC signal into a differential full-swing AC signal.

The first voltage level shifter implementation 704 includes the input PMOS transistors P601P, P601N and the pair of opposite-polarity, cross-coupled, NMOS load chain transistors N602P, N602N familiar from the non-specific voltage level shifter 604 of FIG. 6. As in the non-specific voltage level shifter 604 of FIG. 6, the input terminal $V_{IP}$ connects to the gate of first input PMOS transistor P601P and the input terminal $V_{IN}$ connects to the gate of the second input PMOS transistor P601N. The first regulated current source 612P is implemented as a first current source NMOS transistor N701P and the second regulated current source 612N is implemented as a second current source NMOS transistor N701N. In particular, the drain of the first current source NMOS transistor N701P is connected to the source of the first NMOS load chain transistor N602P and the source of the first current source NMOS transistor N701P is connected to the supply voltage $V_{SS}$. Furthermore, the drain of the second current source NMOS transistor N701N is connected to the source of the second NMOS load chain transistor N602N and the source of the second current source NMOS transistor N701N is connected to the supply voltage $V_{SS}$.

The first reference generator implementation 706 connects to a reference source to receive the bias voltage $V_{BP}$ and includes a first bias generation PMOS transistor P701, a first bias generation NMOS transistor N701 and a second bias generation NMOS transistor N702. In particular, the source of the first bias generation PMOS transistor P701 is connected to the supply voltage $V_{DD}$, the drain of the first bias generation PMOS transistor P701 is connected to the drain of the second bias generation NMOS transistor N702 and the gate of the first bias generation PMOS transistor P701 is connected to the input to the first reference generator implementation 706 that receives the bias voltage $V_{BP}$. The gate of the second bias generation NMOS transistor N702 is connected to the supply voltage $V_{DD}$ and the source of the second bias generation NMOS transistor N702 is connected to the drain of the first bias generation NMOS transistor N701. The gate of the first bias generation NMOS transistor N701 is connected to the drain of the first bias generation NMOS transistor N701 and also acts as the reference voltage $V_{RF}$ output from the first reference generator implementation 706. The source of the first bias generation NMOS transistor N701 is connected to the supply voltage $V_{SS}$.

The reference voltage $V_{RF}$ output from the first reference generator implementation 706 is received at the reference voltage terminal and subsequently at the gate of the first current source NMOS transistor N701P and at the gate of the second current source NMOS transistor N701N.

In operation, the first bias generation PMOS transistor P701, being similar to the input PMOS transistors P601P, P601N of the first voltage level shifter implementation 704, produces a current proportional to the maximum current that the input PMOS transistors P601P, P601N can produce when their gates, which are connected to the differential input terminals $V_{IP}$ and $V_{IN}$, are at the lower level of the voltage swing U. In this example, the lower level of the voltage swing U is close to the bias voltage $V_{BP}$ and the first bias generation PMOS transistor P701 receives the bias voltage $V_{BP}$ at its gate.

A reference current, $I_{REF}$, flows through a bias generation chain comprising the first bias generation NMOS transistor N701 and the second bias generation NMOS transistor N702. The bias generation chain mimics the load chains formed as a combination of the first NMOS load chain transistor N602P and the first current source NMOS transistor N701P in one case and formed as a combination of the second NMOS load chain transistor N602N and the second current source NMOS transistor N701N in the other case. The gate of the second bias generation NMOS transistor N702 is connected to the supply voltage $V_{DD}$, which voltage level is representative of the highest level of voltage attainable by the gate of the first NMOS load chain transistor N602P and the gate of the second NMOS load chain transistor N602N.

As illustrated in FIG. 7, a pull-down current $I_P$ flows through the first NMOS load chain transistor N602P and the first current source NMOS transistor N701P. Additionally, a pull-down current $I_N$ flows through the second current source NMOS transistor N701N and the second NMOS load chain transistor N602N. When the pull-down current $I_P$ is flowing in the first load chain of the first voltage level shifter implementation 704, the relationship to the reference current, $I_{REF}$, flowing through the bias generation chain in the first reference generator implementation 706 is given by $I_P=m*I_{REF}$, where the value of "m" is determined from a ratio of the size of the first bias generation NMOS transistor N701 to the size of the first current source NMOS transistor N701P. When the pull-down current $I_N$ is flowing in the second load chain of the first voltage level shifter implementation 704, the relationship to the reference current, $I_{REF}$, flowing through the bias generation chain in the first reference generator implementation 706 is given by $I_N=m*I_{REF}$, where the value of "m" is determined from a ratio of the size of the first bias generation NMOS transistor N701 to the size of the second current source NMOS transistor N701N. Notably, the first current source NMOS transistor N701P and the second current source NMOS transistor N701N should be very similar, if not identical. Accordingly, the value of "m" should be the same for both current source NMOS transistors N701P, N701N.

Conveniently, the pull-down currents (i.e., $I_P$ or $I_N$) of the load chains are expected to track the peak current capability of the input PMOS transistors P601P, P601N, which peak current capability, in turn, is expected to vary as the swing U varies.

Figure 8:
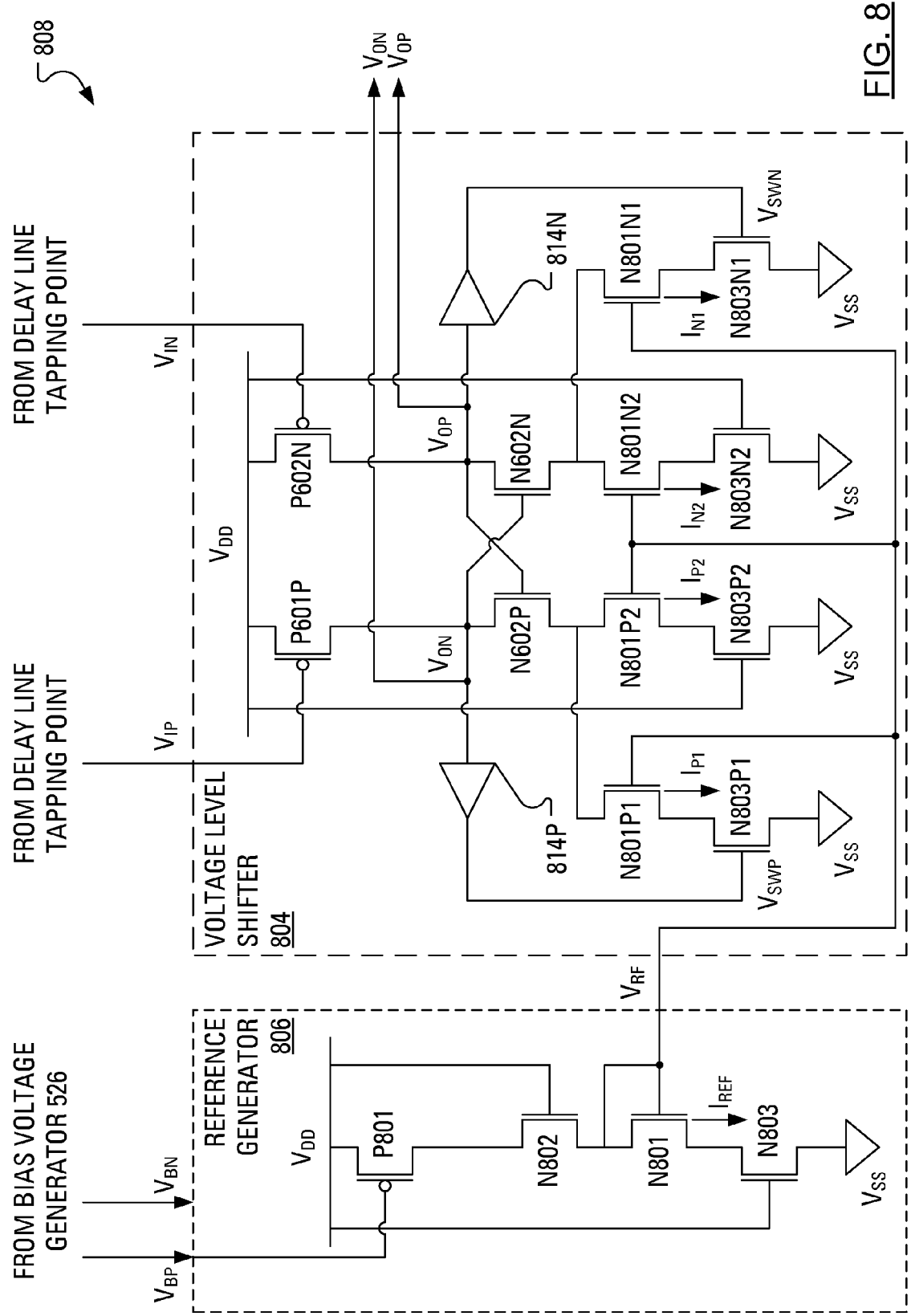
FIG. 8 illustrates details of the voltage level shifter and the reference generator of FIG. 5 according to a further example embodiment.

A second possible implementation 804 of the non-specific voltage level shifter 604 of FIG. 6 in combination with a second possible implementation 806 of the reference generator 506 are illustrated together in FIG. 8 as making up a buffer 808. The second voltage level shifter implementation 804 of FIG. 8 includes the input PMOS transistors P601P, P601N and the pair of opposite-polarity, cross-coupled, NMOS load chain transistors N602P, N602N familiar from the non-specific voltage level shifter 604 of FIG. 6. As in the non-specific voltage level shifter 604 of FIG. 6, the input terminal $V_{IP}$ connects to the gate of first input PMOS transistor P601P and the input terminal $V_{IN}$ connects to the gate of the second input PMOS transistor P601N.

The first regulated current source 612P is interposed between the first NMOS load chain transistor N602P and the supply voltage $V_{SS}$ and is implemented in two paths: a path P1; and a path P2. A pull-down current $I_{P1}$ flows in path P1 and a pull-down current $I_{P2}$ flows in path P2. In the path P1, the drain of a first path P1 NMOS transistor N801P1 is connected to the source of the first NMOS load chain transistor N602P and the drain of a second path P1 NMOS transistor N803P1 is connected to the source of the first path P1 NMOS transistor N801P1. The source of the second path P1 NMOS transistor N803P1 is connected to the supply voltage $V_{SS}$. In the path P2, the drain of a first path P2 NMOS transistor N801P2 is connected to the source of the first NMOS load chain transistor N602P and the drain of a second path P2 NMOS transistor N803P2 is connected to the source of the first path P2 NMOS transistor N801P2. The source of the second path P2 NMOS transistor N803P2 is connected to the supply voltage $V_{SS}$ and the gate of the second path P2 NMOS transistor N803P2 is connected to the supply voltage $V_{DD}$.

The second regulated current source 612N is interposed between the second NMOS load chain transistor N602N and the supply voltage $V_{SS}$ and is also implemented in two paths: a path N1; and a path N2. A pull-down current $I_{N1}$ flows in path N1 and a pull-down current $I_{N2}$ flows in path N2. In the path N1, the drain of a first path N1 NMOS transistor N801N1 is connected to the source of the second NMOS load chain transistor N602N and the drain of a second path N1 NMOS transistor N803N1 is connected to the source of the first path N1 NMOS transistor N801N1. The source of the second path N1 NMOS transistor N803N1 is connected to the supply voltage $V_{SS}$. In the path N2, the drain of a first path N2 NMOS transistor N801N2 is connected to the source of the second NMOS load chain transistor N602N and the drain of a second path N2 NMOS transistor N803N2 is connected to the source of the first path N2 NMOS transistor N801N2. The source of the second path N2 NMOS transistor N803N2 is connected to the supply voltage $V_{SS}$ and the gate of the second path N2 NMOS transistor N803N2 is connected to the supply voltage $V_{DD}$.

The second reference generator implementation 806 connects to a reference source to receive the bias voltage $V_{BP}$ and includes a first bias generation PMOS transistor P801, a first bias generation NMOS transistor N801, a second bias generation NMOS transistor N802 and a third bias generation NMOS transistor N803. In particular, the source of the first bias generation PMOS transistor P801 is connected to the supply voltage $V_{DD}$, the drain of the first bias generation PMOS transistor P801 is connected to the drain of the second bias generation NMOS transistor N802 and the gate of the first bias generation PMOS transistor P801 is connected to the input to the second reference generator implementation 806 that receives the bias voltage $V_{BP}$. The gate of the second bias generation NMOS transistor N802 is connected to the supply voltage $V_{DD}$ and the source of the second bias generation NMOS transistor N802 is connected to the drain of the first bias generation NMOS transistor N801. The gate of the first bias generation NMOS transistor N801 is connected to the drain of the first bias generation NMOS transistor N801 and also acts as the reference voltage $V_{RF}$ output from the second reference generator implementation 806. The source of the first bias generation NMOS transistor N801 is connected to the drain of the third bias generation NMOS transistor N803. The gate of the third bias generation NMOS transistor N803 is connected to the supply voltage $V_{DD}$ and the source of the third bias generation NMOS transistor N803 is connected to the supply voltage $V_{SS}$.

The reference voltage $V_{RF}$ output from the second reference generator implementation 806 is received at the reference voltage terminal and then, from left to right, the gate of the first path P1 NMOS transistor N801P1, the gate of the first path P2 NMOS transistor N801P2, the gate of the first path N2 NMOS transistor N801N2 and the gate of the first path N1 NMOS transistor N801N1.

In contrast to the first voltage level shifter implementation 704 of FIG. 7, the second voltage level shifter implementation 804 of FIG. 8 includes implementations of the feedback elements 614P, 614N, which were presented in FIG. 6. In particular, the first feedback element 614P is implemented as a first digital buffer 814P and the second feedback element 614N is implemented as a second digital buffer 814N. As will be clear to a person of ordinary skill, digital buffers are most commonly made of an even number of serially connected inverters, but may also take the form of a First-In-First-Out (FIFO) memory.

The input to the first digital buffer 814P is received at the output terminal $V_{ON}$ and the output of the first digital buffer 814P is connected to the gate of the second path P1 NMOS transistor N803P1. The input to the second digital buffer 814N is received at the output terminal $V_{OP}$ and the output of the second digital buffer 814N is connected to the gate of the second path N1 NMOS transistor N803N1.

In the operation of the second voltage level shifter implementation 804 of FIG. 8, the load chain current sources are regulated both by the second reference generator implementation 806 and by the digital buffers 814P, 814N. In a manner similar to the first reference generator implementation 706, the second reference generator implementation 806 reproduces and monitors the maximum current of the input PMOS transistors P601P, P601N. The third bias generation NMOS transistor N803 compensates for the resistance of the bottom transistors in the various paths of the dual-path regulated current sources, namely the second path P1 NMOS transistor N803P1 and the second path N1 NMOS transistor N803N1, as well as the second path N2 NMOS transistor N803N2 and the second path P2 NMOS transistor N803P2. In particular, the third bias generation NMOS transistor N803 allows the chain that includes the second bias generation NMOS transistor N802, the first bias generation NMOS transistor N801 and the third bias generation NMOS transistor N803 to appropriately mimic, for the purpose of current mirroring, the operation of the chain that includes, for example, the first NMOS load chain transistor N602P, the first path P2 NMOS transistor N801P2 and the second path P2 NMOS transistor N803P2.

A reference current, $I_{REF}$, flows through a bias generation chain comprising the second bias generation NMOS transistor N802, the first bias generation NMOS transistor N801 and the third bias generation NMOS transistor N803. The bias generation chain mimics the load chains in the second voltage level shifter implementation 804. The gate of the second bias generation NMOS transistor N802 is connected to the supply voltage $V_{DD}$, which voltage level is representative of the highest level of voltage attainable by the gate of the first NMOS load chain transistor N602P and the gate of the second NMOS load chain transistor N602N.

The NMOS load chain devices in the second voltage level shifter implementation 804, the first bias generation NMOS transistor N801 and the third bias generation NMOS transistor N803 together form a current mirror. Conveniently, the current mirror establishes a relationship between the reference current $I_{REF}$ and the load chain currents $I_{P1}$, $I_{P2}$, $I_{N1}$, $I_{N2}$. All four load chain currents $I_{P1}$, $I_{P2}$, $I_{N1}$, $I_{N2}$ are fractions of the reference current $I_{REF}$, which, in turn, is proportional to the maximum current of the input PMOS transistors P601P, P601N reproduced by the first bias generation PMOS transistor P801 in the reference generator 806. The first bias generation PMOS transistor P801 in the reference generator 806 may be similar in size to the input PMOS transistors P601P, P601N of the buffer 808, in which case they produce a current $I_{REF}$ close to the actual maximum currents of the input PMOS transistors P601P, P601N. If the first bias generation PMOS transistor P801 is different in size from the input PMOS transistors P601P, P601N, the current $I_{REF}$ is a scaled replica of the maximum current of the input PMOS transistors P601P, P601N. This scaling factor will, in turn, reflect on the size ratio of the current mirror (ratio of the sizes of the third bias generation NMOS transistor N803 to the sizes of the bottom transistors in the various paths of the dual-path regulated current sources N803P1/N803P2/N803N1/N803N2 and ratio of the sizes of the first bias generation NMOS transistor N801 to the sizes of the top transistors in the various paths of the dual-path regulated current sources N801P1/N801P2/N801N1/N801N2.

In particular, one of the ways to describe the ratios may be following: $I_{P1}=I_{N1}=a*I_{REF}$ and $I_{P2}=I_{N2}=b*I_{REF}$. The coefficients a and b are set by the size ratios. In other words, the value of a is related to a ratio of the sizes of the second path N1 NMOS transistor N803N1 and the second path P1 NMOS transistor N803P1 to the size of the third bias generation NMOS transistor N803. The value of a is also related to a ratio of the sizes of the first path N1 NMOS transistor N801N1 and the first path P1 NMOS transistor N801P1 to the size of the first bias generation NMOS transistor N801. For another instance, the value of b is related to a ratio of the sizes of the second path P2 NMOS transistor N803P2 and the second path N2 NMOS transistor N803N2 to the size of the third bias generation NMOS transistor N803. The value of b is also related to a ratio of the sizes of the first path N2 NMOS transistor N801N2 and the first path P2 NMOS transistor N801P2 to the size of the first bias generation NMOS transistor N801.

There are four current sources in FIG. 8: the first current source consists of the first path P1 NMOS transistor N801P1 and the second path P1 NMOS transistor N803P1; and the second current source consists of the first path P2 NMOS transistor N801P2 and the second path P2 NMOS transistor N803P2. The first and second current sources together make a combined current source with a variable current value. The combined current source corresponds to the first regulated current source 612P of FIG. 6. The third current source consists of the first path N1 NMOS transistor N801N1 and the second path N1 NMOS transistor N803N1. The fourth current source consists of the first path N2 NMOS transistor N801N2 and the second path N2 NMOS transistor N803N2. The third and fourth current sources together make a combined current source that corresponds to the second regulated current source 612N of FIG. 6.

Typically, in order to balance transition rates at the output nodes $V_{OP}$ and $V_{ON}$, it is chosen that $I_{P1}=I_{N1}$ and $I_{P2}=I_{N2}$. It is anticipated that the ratio of the value of the reference current $I_{REF}$ to the total current $(I_{P1}+I_{P2})$ in path P1 and path P2 will be a constant, "k". Furthermore, it is anticipated that the ratio of the value of the reference current $I_{REF}$ to the total current $(I_{N1}+I_{N2})$ in path N1 and path N2 will be equivalent to the same constant, "k". The value of "k" is determined by a ratio of the size of the first bias generation NMOS transistor N801 to the size of the first path P1 NMOS transistor N801P1 and the size of the first path P2 NMOS transistor N801P2. The value of "k" will also be determined by a ratio of the size of the first bias generation NMOS transistor N801 to the size of the first path N1 NMOS transistor N801N1 and the size of the first path N2 NMOS transistor N801N2. Notably, the first path P1 NMOS transistor N801P1, the first path P2 NMOS transistor N801P2, the first path N1 NMOS transistor N801N1 and the first path N2 NMOS transistor N801N2 should be structurally very similar, if not identical. Value of the coefficient "k" might be determined, alternatively or in part, by the ratio of the sizes of the first bias generation PMOS transistor P801 to sizes of the input PMOS transistors P601P, P601N.

In review, in path P2, the gate of the second path P2 NMOS transistor N803P2 is connected to the supply voltage $V_{DD}$, thereby permanently enabling the current $I_{P2}$ in path P2. Furthermore, in path N2, the gate of the second path N2 NMOS transistor N803N2 is connected to the supply voltage $V_{DD}$, thereby permanently enabling the current $I_{N2}$ in path N2.

The first digital buffer 814P delays signal propagation from node $V_{ON}$ to the gate of the second path P1 NMOS transistor N803P1. The second digital buffer 814N delays signal propagation from the node $V_{OP}$ to the gate of the second path N1 NMOS transistor N803N1.

The first digital buffer 814P and the second digital buffer 814N are characterized by a predetermined delay of signal propagation from their inputs to their outputs.

A first feedback signal at the output of the first digital buffer 814P, which first feedback signal is identified in FIG. 8 as $V_{SWP}$, controls the amount of current flowing in the path P1 based on the voltage level at the output terminal $V_{ON}$. In particular, at a time x seconds, where x seconds is the predetermined delay, after the voltage at the output terminal $V_{ON}$ has gone high, the first feedback signal $V_{SWP}$ goes high and turns on the second path P1 NMOS transistor N803P1, thereby enabling the current in the path P1. At a time x seconds after the voltage at the output terminal $V_{ON}$ has gone low, the first feedback signal $V_{SWP}$ goes low and turns off the second path P1 NMOS transistor N803P1, thereby disabling the current in the path P1.

Conveniently, the allowance, by the second path P1 NMOS transistor N803P1, of the flow of current in the path P1 becomes important when the voltage at the output terminal $V_{ON}$ goes through a transition from high to low. The two-path load chains of the second voltage level shifter implementation 804 allow the speed of the transition from high to low to be increased, relative to the transitions speed available using the single-path load chains of the first voltage level shifter implementation 704.

Much in the same way that the first digital buffer 814P controls the flow of current in the path P1 based on a delayed version of the voltage at output terminal $V_{ON}$, the second digital buffer 814N controls the flow of current in the path N1 based on a delayed version of the voltage at output terminal $V_{OP}$.

In an alternative implementation for the second voltage level shifter implementation 804 of FIG. 8, input of the second digital buffer 814N is connected to the output terminal $V_{ON}$, and the input of the first digital buffer 814P is connected to the output terminal $V_{OP}$. In this case, the first digital buffer 814P and the second digital buffer 814N will be required to invert and will, for example, consist of an odd number of serially connected inverters.

Figure 9:
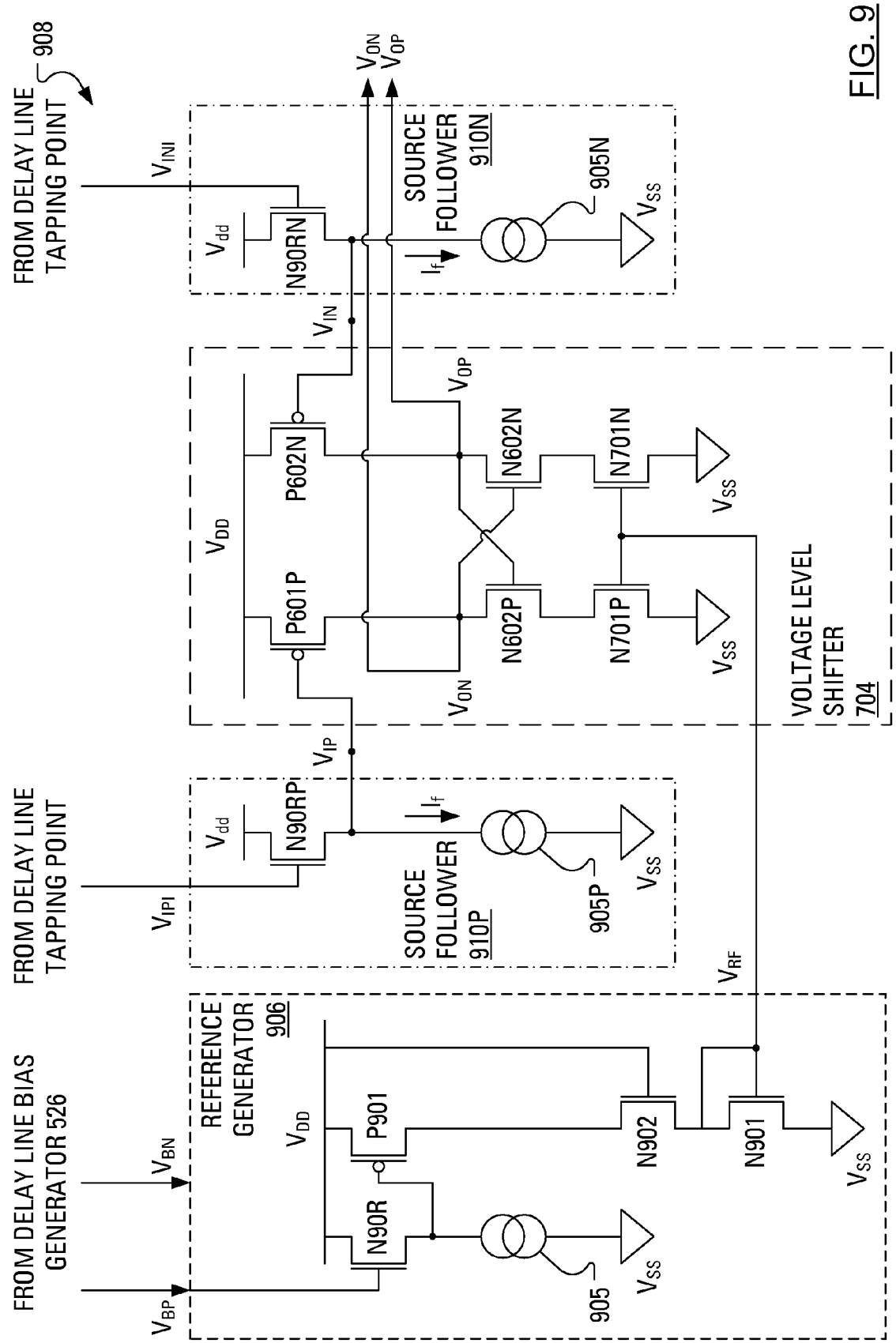
FIG. 9 illustrates details of the voltage level shifter and the reference generator of FIG. 5 according to a still further example embodiment.

FIG. 9 illustrates the first voltage level shifter implementation 704 in a buffer 908 with a third possible implementation 906 of the reference generator 506. The buffer 908 also includes a first source follower 910P and a second source follower 910N at the inputs of the first voltage level shifter implementation 704.

The third reference generator implementation 906 connects to a reference source to receive the bias voltage $V_{BP}$ and includes a first bias generation PMOS transistor P901, a first bias generation NMOS transistor N901, a second bias generation NMOS transistor N902, a bias generation source follower transistor N90R and a bias generation current source 905. In particular, the drain of the bias generation source follower transistor N90R is connected to the supply voltage $V_{DD}$, the source of the bias generation source follower transistor N90R is connected to the bias generation current source 905 and the gate of the bias generation source follower transistor N90R is connected to the input to the third reference generator implementation 906 that receives the bias voltage $V_{BP}$. The source of the first bias generation PMOS transistor P901 is connected to the supply voltage $V_{DD}$, the drain of the first bias generation PMOS transistor P901 is connected to the drain of the second bias generation NMOS transistor N902 and the gate of the first bias generation PMOS transistor P901 is connected to the source of the bias generation source follower transistor N90R. The gate of the second bias generation NMOS transistor N902 is connected to the supply voltage $V_{DD}$ and the source of the second bias generation NMOS transistor N902 is connected to the drain of the first bias generation NMOS transistor N901. The gate of the first bias generation NMOS transistor N901 is connected to the drain of the first bias generation NMOS transistor N901 and also acts as the reference voltage $V_{RF}$ output from the third reference generator implementation 906. The source of the first bias generation NMOS transistor N901 is connected to the supply voltage $V_{SS}$.

The reference voltage $V_{RF}$ output from the third reference generator implementation 906 is received at the reference voltage terminal and then at the gate of the first current source NMOS transistor N701P and at the gate of the second current source NMOS transistor N701N.

The first source follower 910P and the second source follower 910N are presented as optional examples of the input buffers 510P, 510N illustrated in FIG. 5 as interposing the delay line and the voltage level shifter 504. In particular, the first source follower 910P includes a first source follower NMOS transistor N90RP and a first current source 905P. Similarly, the second source follower 910N includes a second source follower NMOS transistor N90RN and a second current source 905N.

The drain of the first source follower NMOS transistor N90RP is connected to the supply voltage $V_{DD}$ and the gate of the first source follower NMOS transistor N90RP is connected to an alternative input terminal $V_{IPI}$. The first current source 905P is connected between the source of the first source follower NMOS transistor N90RP and the supply voltage $V_{SS}$.

The drain of second first source follower NMOS transistor N90RN is connected to the supply voltage $V_{DD}$ and the gate of the second source follower NMOS transistor N90RN is connected to an alternative input terminal $V_{INI}$. The second current source 905N is connected between the source of the second source follower NMOS transistor N90RN and the supply voltage $V_{SS}$.

The gate of the first input PMOS transistor P601P connects to the source of the first source follower NMOS transistor N90RP.

The gate of the second input PMOS transistor P601N connects to the source of the second source follower NMOS transistor N90RN.

In keeping with the voltage level shifter 504 of FIG. 5, the input terminal $V_{IPI}$ of the first voltage level shifter implementation 704 is illustrated in FIG. 9 as connecting to the delay line tapping point though the first source follower 910P. As mentioned hereinbefore, the first source follower 910P is an example implementation of the first input buffer 510P. Similarly, by interposing the input terminal $V_{OP}$ and the delay line tapping point, the second source follower 910N is an example implementation of the second input buffer 510N. A first source follower input terminal $V_{IPI}$ and a second source follower input terminal $V_{INI}$ are connected to the tapping points.

It is expected that the voltage level shifter 504 may be used in high-frequency applications, wherein the slew rate at the output terminals $V_{ON}$ and $V_{OP}$ needs to be increased. The slew rate at the output terminals $V_{ON}$ and $V_{OP}$ is determined by currents in the input PMOS transistors P601P, P601N. One way to increase the current in the input PMOS transistors P601P, P601N is to increase the size of the input PMOS transistors P601P, P601N. However, as the size of the input PMOS transistors P601P, P601N is increased, the load at the tapping points of the delay chain is also increased. By designing the buffer 908 so that the source follower NMOS transistors N90RP, N90RN are much smaller than the input PMOS transistors P601P, P601N, the use of the source followers 910P, 910N may be seen to reduce load at the tapping points of the delay chain.

Another function of the source followers 910P, 910N is to bring down voltage levels of the voltage swing at the gates of the input PMOS transistors P601P, P601N. The first input PMOS transistor P601P conducts when the gate voltage drops below $V_{DD}-V_{TP}$, where $V_{TP}$ is the threshold voltage of the first input PMOS transistor P601P. Without the source followers 910P, 910N, the voltage at the gate of the input PMOS transistor P601P, for example, swings between the supply voltage $V_{DD}$ and the bias voltage $V_{BP}$. That is, the peak of the voltage swing at the gates of the first input PMOS transistor P601P is the supply voltage $V_{DD}$. With the source followers 910P, 910N, the voltage at the gate of the input PMOS transistor P601P swings between $V_{DD}-V_{TN}$ and $V_{BP}-V_{TN}$, where $V_{TN}$ is the gate-to-source voltage of the first source follower NMOS transistor N90RP. That is, the peak of the voltage swing at the gates of the first input PMOS transistor P601P is $V_{DD}-V_{TN}$. Since $V_{DD}-V_{TN}$ is closer to $V_{DD}-V_{TP}$ than the supply voltage $V_{DD}$ is to $V_{DD}-V_{TP}$, the time necessary for the first input PMOS transistor P601P to start driving (conducting current) is reduced. The operation of the second input PMOS transistor P601N may be analyzed similarly.

The buffer 908 of FIG. 9 shows only one implementation of the source followers 910P, 910N, the operation of which depends, for example, on both the threshold voltage $V_{TP}$ of the input PMOS transistors P601P, P601N and the gate-to-source voltage $V_{TN}$ of the first source follower NMOS transistor N90RP. Unfortunately, the PMOS threshold voltage, $V_{TP}$, and the NMOS gate-to-source voltage, $V_{TN}$, have different dependences on operation conditions (e.g., temperature) and process parameters variations. One of ordinary skill in the art will understand that further implementations of the source followers 910P, 910N can be built so that better voltage compensation can be achieved.

A voltage level shifter built in accordance with example embodiments may be adjusted to handle various combinations of power supply voltage level (the supply voltage $V_{DD}$ in all the examples above) and input voltage swing. For instance, in order to accommodate a particular voltage combination, schemes can be "$V_{DD}$-$V_{SS}$ mirrored". That is, NMOS devices used in place of PMOS devices and PMOS devices used in place of NMOS devices, with necessary size adjustments. The skilled practitioner will also recognize that such transformations serve only to adapt different voltage conditions and do not deviate from main ideas of example embodiments.

Figure 10:
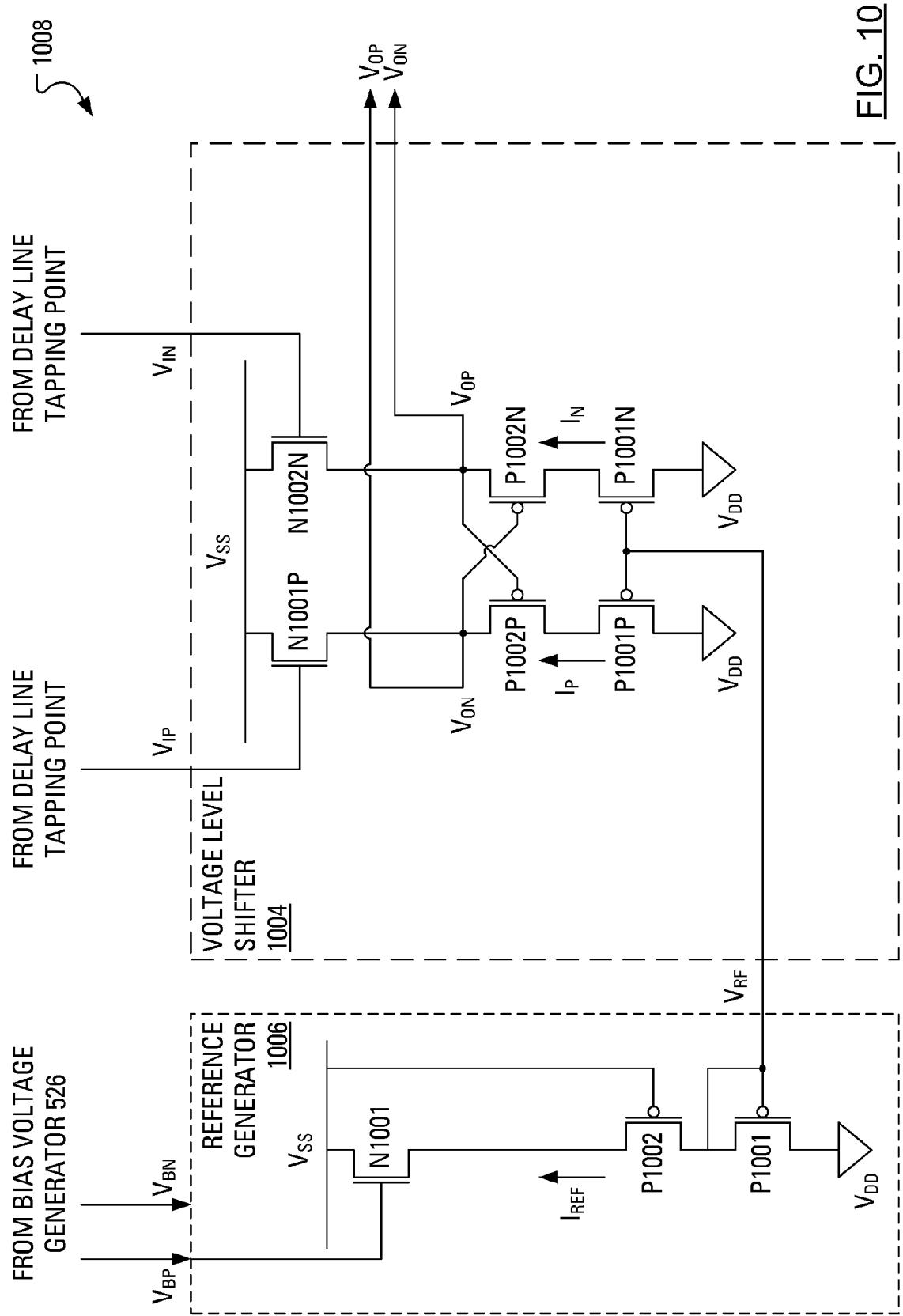
FIG. 10 illustrates details of the voltage level shifter and the reference generator of FIG. 5 according to an even further example embodiment.

FIG. 10 is presented as an illustrative example of $V_{DD}$-$V_{SS}$ mirroring. In particular, a buffer 1008 in FIG. 10 is representative of the buffer 708 of FIG. 7 wherein NMOS devices have been used in place of PMOS devices and PMOS devices have been used in place of NMOS devices, with necessary size adjustments.

A third possible implementation 1004 of the non-specific voltage level shifter 604 of FIG. 6 in combination with a fourth possible implementation 1006 of the reference generator 506 of FIGS. 5 and 6 are illustrated together in FIG. 10 as forming the buffer 1008. Absent from the third voltage level shifter implementation 1004 are implementations of the feedback elements 614P, 614N.

The third voltage level shifter implementation 1004 includes a first input NMOS transistor N1001P, a second input NMOS transistor N1001N, a first PMOS load chain transistor P1002P and a second PMOS load chain transistor P1002N. The input terminal $V_{IP}$ connects to the gate of the first input NMOS transistor N1001P and the input terminal $V_{IN}$ connects to the gate of the second input NMOS transistor N1001N. The first regulated current source 612P is implemented as a first current source PMOS transistor P1001P and the second regulated current source 612N is implemented as a second current source PMOS transistor P1001N. In particular, the drain of the first current source PMOS transistor P1001P is connected to the source of the first PMOS load chain transistor P1002P and the source of the first current source PMOS transistor P1001P is connected to the supply voltage $V_{DD}$. Furthermore, the drain of the second current source PMOS transistor P1001N is connected to the source of the second PMOS load chain transistor P1002N and the source of the second current source PMOS transistor P1001N is connected to the supply voltage $V_{DD}$.

The fourth reference generator implementation 1006 connects to a reference source to receive the bias voltage $V_{BP}$ and includes a first bias generation NMOS transistor N1001, a first bias generation PMOS transistor P1001 and a second bias generation PMOS transistor P1002. In particular, the source of the first bias generation NMOS transistor N1001 is connected to the supply voltage $V_{SS}$, the drain of the first bias generation NMOS transistor N1001 is connected to the drain of the second bias generation PMOS transistor P1002 and the gate of the first bias generation NMOS transistor N1001 is connected to the input to the fourth reference generator implementation 1006 that receives the bias voltage $V_{BP}$. The gate of the second bias generation PMOS transistor P1002 is connected to the supply voltage $V_{SS}$ and the source of the second bias generation PMOS transistor P1002 is connected to the drain of the first bias generation PMOS transistor P1001. The gate of the first bias generation PMOS transistor P1001 is connected to the drain of the first bias generation PMOS transistor P1001 and also acts as the reference voltage $V_{RF}$ output from the fourth reference generator implementation 1006. The source of the first bias generation PMOS transistor P1001 is connected to the supply voltage $V_{DD}$.

The reference voltage $V_{RF}$ output from the fourth reference generator implementation 1006 is received at the reference voltage terminal and subsequently at the gate of the first current source PMOS transistor P1001P and at the gate of the second current source PMOS transistor P1001N.

In operation, the first bias generation NMOS transistor N1001, being similar to the input NMOS transistors P1001P, P1001N of the third voltage level shifter implementation 1004, produces a current proportional to the maximum current that the input NMOS transistors N1001P, N1001N can produce when their gates, which are connected to the differential input terminals $V_{IP}$ and $V_{IN}$, are at the lower level of the voltage swing U.

A reference current, $I_{REF}$, flows through a bias generation chain comprising the first bias generation PMOS transistor P1001 and the second bias generation PMOS transistor P1002. The bias generation chain mimics the load chains formed as a combination of the first PMOS load chain transistor P1002P and the first current source NMOS transistor P1001P in one case and formed as a combination of the second PMOS load chain transistor P1002N and the second current source NMOS transistor P1001N in the other case. The gate of the second bias generation PMOS transistor P1002 is connected to the supply voltage $V_{SS}$, which voltage level is representative of the lowest level of voltage attainable by the gate of the first PMOS load chain transistor P1002P and the gate of the second PMOS load chain transistor P1002N.

As illustrated in FIG. 10, a pull-down current $I_P$ flows through the first PMOS load chain transistor P1002P and the first current source PMOS transistor P1001P. Additionally, a pull-down current $I_N$ flows through the second current source PMOS transistor P1001N and the second PMOS load chain transistor P1002N. When the pull-down current $I_P$ is flowing in the first load chain of the third voltage level shifter implementation 1004, the relationship to the reference current, $I_{REF}$, flowing through the bias generation chain in the fourth reference generator implementation 1006 is given by $I_P=m^*I_{REF}$, where the value of "m" is determined from a ratio of the size of the first bias generation PMOS transistor P1001 to the size of the first current source PMOS transistor P1001P. When the pull-down current $I_N$ is flowing in the second load chain of the third voltage level shifter implementation 1004, the relationship to the reference current, $I_{REF}$, flowing through the bias generation chain in the fourth reference generator implementation 1006 is given by $I_N=m^*I_{REF}$, where the value of "m" is determined from a ratio of the size of the first bias generation PMOS transistor P1001 to the size of the second current source PMOS transistor P1001N. Notably, the first current source PMOS transistor P1001P and the second current source NMOS transistor P1001N should be very similar, if not identical. Accordingly, the value of "m" should be the same for both current source NMOS transistors P1001P, P1001N.

Conveniently, the pull-down currents (i.e., $I_P$ or $I_N$) of the load chains are expected to track the peak current capability of the input PMOS transistors N1001P, N1001N, which peak current capability, in turn, is expected to vary as the swing U varies.

Conveniently, aspects of the proposed voltage level shifter may be found to result in a reduction of power consumption with limited or no DC current thanks to a cross-coupled transistor connection in the load chain. Generally, the load chain consumes current during an AC signal transition only and preferably does not have DC component in current consumption.

While the cross-coupling of the first NMOS load chain transistor N602P and the second NMOS load chain transistor N602N might be seen to introduce a hysteresis effect. The dynamically changing operation current values in the load chain controlled by the current sources help to mitigate the hysteresis effect. In this manner, the current in the load chain transistors N602P, N602N dynamically tracks the current in the input PMOS transistors P601P, P601N.

Further conveniently, the use of the source followers 910P, 910N may be seen to reduce load at the tapping points of the delay chain.

The above-described embodiments of the present application are intended to be examples only. Alterations, modifications and variations may be effected to the particular embodiments by those skilled in the art without departing from the scope of the application, which is defined by the claims appended hereto.

What is claimed is:

1. A Delay Locked Loop comprising:
a voltage controlled delay line, said voltage controlled delay line including:
a plurality of delay elements serially connected by a differential pair of delay lines;
a bias voltage generator for providing a first bias voltage and a second bias voltage to each delay element of said plurality of delay elements; and
a buffer, said buffer including:
a voltage level shifting circuit, said voltage level shifting circuit including:
an input circuit including a pair of input field effect transistors (FETs) of a first polarity, said input circuit receiving a differential input signal from said differential pair of delay lines and connected between a first supply voltage and a pair of output nodes, said differential input signal varying between an input high level and an input low level; and
a load chain circuit including a pair of cross-coupled load chain FETs of a second polarity, respective gates of said pair of cross-coupled load chain FETs connected to respective nodes of said pair of output nodes, said load chain circuit receiving a reference voltage and including a pair of regulated current sources, said current sources regulated by said reference voltage, said load chain circuit connected directly between a second supply voltage and said pair of output nodes such that an output signal at said output nodes varies between an output high level and an output low level, where said output low level is shifted relative to said input low level;
a reference voltage generator for receiving said first bias voltage and generating, based on said first bias voltage, said reference voltage received at said voltage level shifting circuit.

2. The Delay Locked Loop of claim 1 wherein each current source of said current sources is a current source FET having a gate connected to receive said reference voltage.

3. The Delay Locked Loop of claim 1 wherein:
said pair of input FETs are P-type metal oxide semiconductor (PMOS) devices; and
said pair of cross-coupled load chain FETs are N-type metal oxide semiconductor (NMOS) devices.

4. The Delay Locked Loop of claim 1 wherein:
said pair of input FETs are N-type metal oxide semiconductor (NMOS) devices; and
said pair of cross-coupled load chain FETs are P-type metal oxide semiconductor (PMOS) devices.

5. The Delay Locked Loop of claim 1 wherein said input low level varies according to changes in said first bias voltage.

* * * * *